US005679494A

United States Patent [19]

Minami et al.

[11] Patent Number: 5,679,494

[45] Date of Patent: Oct. 21, 1997

[54] HEAT-SENSITIVE RECORDING MATERIAL COMPRISING A DIAZONIUM SALT, A COUPLER AND A BENZOTRIAZOLE COMPOUND

[75] Inventors: Kazumori Minami; Ken Iwakura, both of Shizuoka, Japan

[73] Assignee: Fuji Photo Film Co., Ltd., Kanagawa, Japan

[21] Appl. No.: 389,652

[22] Filed: Feb. 16, 1995

[30] Foreign Application Priority Data

Feb. 16, 1994 [JP] Japan .................................... 6-019248

[51] Int. Cl.[6] .............................. G03C 1/72; G03C 1/61; G03F 7/016

[52] U.S. Cl. .......................... 430/138; 430/156; 430/157; 430/162; 430/179; 430/512; 503/227

[58] Field of Search .................................... 430/157, 162, 430/138, 171, 179, 177, 512, 156; 503/227

[56] References Cited

U.S. PATENT DOCUMENTS

| | | | |
|---|---|---|---|
| 4,297,428 | 10/1981 | Yamamoto | 430/179 |
| 4,540,648 | 9/1985 | Scheler | 430/174 |
| 4,575,479 | 3/1986 | Nagamoto et al. | 430/162 |
| 4,770,973 | 9/1988 | Kanda et al. | 430/171 |
| 4,957,847 | 9/1990 | Adam et al. | 430/179 |
| 5,360,692 | 11/1994 | Kawabe et al. | 430/512 |

*Primary Examiner*—John S. Chu

*Attorney, Agent, or Firm*—Sughrue, Mion, Zinn, Macpeak & Seas, PLLC

[57] ABSTRACT

A heat-sensitive recording material comprising a support having thereon a heat-sensitive recording layer and a protective layer in this sequence, said heat-sensitive recording material containing a compound represented by formula (1), (2), (3), or (4):

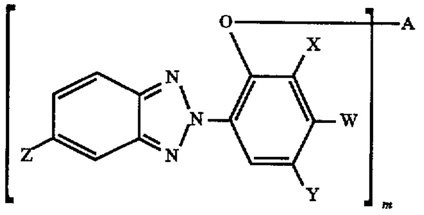

(1)

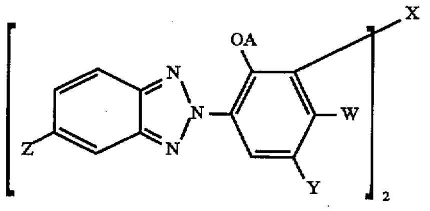

(2)

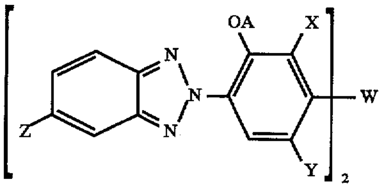

(3)

10 Claims, 1 Drawing Sheet

HEAT-SENSITIVE RECORDING MATERIAL COMPRISING A DIAZONIUM SALT, A COUPLER AND A BENZOTRIAZOLE COMPOUND

FIELD OF THE INVENTION

The present invention relates to a heat-sensitive recording material having an excellent light resistance. More particularly, the present invention relates to a heat-sensitive recording material which exhibits an excellent light resistance as well as an excellent fixability.

BACKGROUND OF THE INVENTION

Heat-sensitive recording can be effected with a simple and reliable recording apparatus requiring no maintenance and thus has been recently developed. As heat-sensitive recording materials for use in heat-sensitive recording there have heretofore been widely known those utilizing the reaction of an electron donative colorless dye with an electron attractive compound and those utilizing the reaction of a diazonium salt compound with a coupler.

For these heat-sensitive recording materials, extensive studies have been recently made of the improvement of properties such as (1) color density and color sensitivity and (2) fastness of coloring materials.

However, these heat-sensitive recording materials are disadvantageous in that when exposed to sunlight for a prolonged period of time or posted on the wall in offices, etc. for a prolonged period of time, it suffers from coloration of the background due to light or discoloration of the image area due to light.

As approaches for eliminating the coloration of the background and the discoloration of the image area, various methods have been proposed. However, these methods do not necessarily exert satisfactory effects.

SUMMARY OF THE INVENTION

It is therefore an object of the present invention to provide a heat-sensitive recording material having an excellent light resistance, more particularly a heat-sensitive recording material which exhibits an excellent light resistance as well as an excellent fixability.

The foregoing object of the present invention will become more apparent from the following detailed description and examples.

The present invention relates to a heat-sensitive recording material comprising a support having thereon a heat-sensitive recording layer and a protective layer in this sequence, the heat-sensitive recording material containing a compound represented by formula (1), (2), (3), or (4):

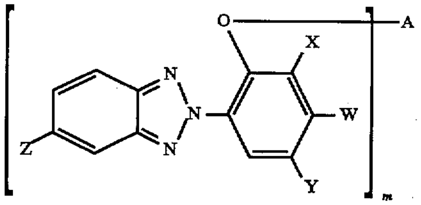
(1)

-continued

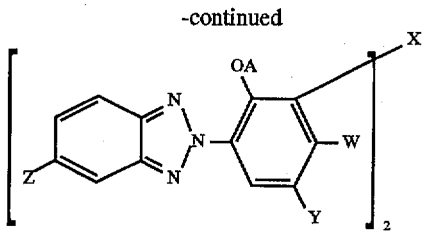
(2)

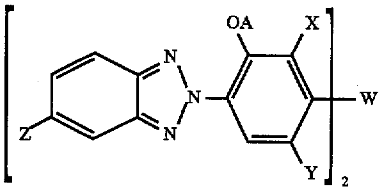
(3)

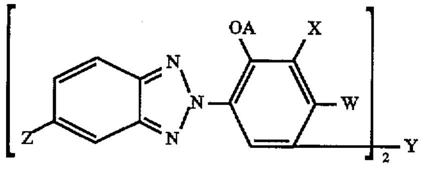
(4)

wherein m represents an integer 1 or 2;

A represents $-SO_2-R$, $-CO-R$, $-CO_2-R$, $-CONH-R$, $-POR_1R_2$, $-CH_2R_3$, or $-SiR_4R_5R_6$, in which R represents an alkyl group or an aryl group, $R_1$ and $R_2$ each independently represent an alkoxy group, an aryloxy group, an alkyl group, or an aryl group, $R_3$ represents a phenyl group substituted by at least one of a nitro group or a methoxy group, and $R_4$, $R_5$, and $R_8$ each independently represent an alkyl group or an aryl group, in formulae (2) to (4) and in formula (1) where m is 1, or represents $-SO_2R_7SO_2-$, $-CO-$, $-COCO-$, $-COR_7CO-$, $-SO_2-$ or $-SO-$, in which $R_7$ represents an alkylene group or an arylene group, in formula (1) where m is 1;

X represents a hydrogen atom, an alkyl group, an alkoxy group, an aryl group, or a halogen atom in formulae (1), (3) and (4), or represents an alkylene group, $-OR_7O-$, or $-OCOR_7CO_2-$ in formula (2);

W represents a hydrogen atom, an alkyl group, an alkoxy group, an aryl group, or a halogen atom in formulae (1), (2) and (4), or represents $-OR_7O-$ or $-OCOR_7CO_2-$ in formula (3);

Y represents a hydrogen atom, an alkyl group, an alkoxy group, an aryl group, or a halogen atom in formulae (1), (2) and (3), or represents $-OR_7O-$, $-OCOR_7CO_2-$, $-CH_2CH_2CO_2R_7OCOCH_2-$, $-CH_2CH_2OCOR_7CO_2CH_2-$, or $-CH_2CH_2CON(R_8)R_7N(R_8)COCH_2CH_2-$, in which $R_8$ represents a hydrogen atom or an alkyl group, in formula (4); and Z represents a hydrogen atom, a halogen atom, an alkyl group, or an alkoxy group.

DETAILED DESCRIPTION OF THE INVENTION

Figure 1:
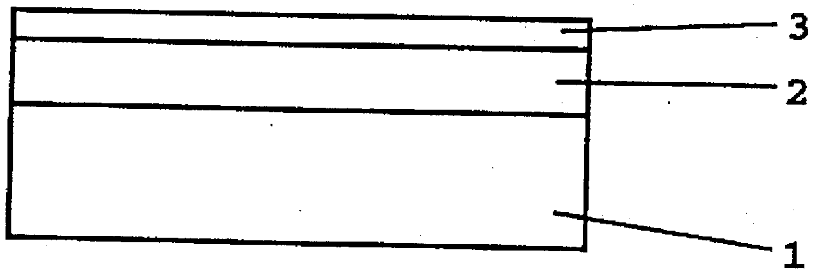
FIG. 1 shows a schematic sectional view of the heat-sensitive recording material according to one embodiment of the present invention.

Among the foregoing substituents, the alkyl group may be straight-chain or branched or may have an unsaturated bond. The alkyl group may further be substituted by an alkoxy group, an aryloxy group, an alkoxycarbonyl group, an aryloxycarbonyl group, an aryl group, a hydroxyl group, etc. The aryl group may further be substituted by an alkyl group, an alkoxy group, or a halogen atom.

Among the foregoing substituents, the alkylene group may be straight-chain or branched or may contain an unsaturated bond, an oxygen atom, a sulfur atom, or a nitrogen atom. The alkylene group may further be substituted by an alkoxy group, a hydroxyl group, an aryloxy group, or an aryl group.

Among the foregoing substituents, the arylene group may further be substituted by an alkyl group, an alkoxy group, a halogen atom, or the like.

Preferred among the substituents represented by X, Y, and W are a hydrogen atom, a $C_{1-18}$ alkyl group, a $C_{1-18}$ alkoxy group, a $C_{6-18}$ aryl group, a fluorine atom, a chlorine atom, and a bromine atom. Particularly preferred among these substituents are a hydrogen atom, a $C_{1-12}$ alkyl group, a $C_{1-12}$ an alkoxy group, a phenyl group, and a chlorine atom.

The term "$C_{m-n}$ alkyl group" and the like used herein means "alkyl group having from m to n carbon atoms" and the like.

Preferred among the substituents represented by Z are a hydrogen atom, a chlorine atom, a fluorine atom, a $C_{1-12}$ alkyl group, and a $C_{1-12}$ alkoxy group. Particularly preferred among the substituents are a hydrogen atom, a chlorine atom, a $C_{1-6}$ alkyl group, and a $C_{1-6}$ alkoxy group.

Preferred among the substituents represented by R are a $C_{1-18}$ alkyl group and a $C_{6-18}$ aryl group. Particularly preferred among the substituents are a $C_{1-12}$ alkyl group and a $C_{6-12}$ aryl group.

Preferred among the substituents represented by $R_1$ and $R_2$ are a $C_{1-12}$ alkoxy group, a $C_{6-12}$ aryloxy group, a $C_{1-12}$ alkyl group, and a $C_{6-12}$ aryl group.

Preferred among the substituents represented by $R_3$ are a 2-nitrophenyl group, a 3,5-dimethoxyphenyl group, and a 3,4,5-trimethoxyphenyl group.

Preferred among the substituents represented by $R_4$, $R_5$, and $R_6$ are a $C_{1-12}$ alkyl group and a $C_{6-12}$ aryl group. Particularly preferred among the substituents are a $C_{1-8}$ alkyl group and a phenyl group.

In the case where the compound represented by formula (1), (2), (3), or (4) is a so-called bis-meric unit having two benzotriazole rings per molecule, the substituent represented by $R_7$ is preferably a $C_{1-12}$ alkylene group or a $C_{6-12}$ arylene group, and the substituent represented by $R_8$ is preferably a hydrogen atom or a $C_{1-6}$ alkyl group.

Particularly preferred among the substituents represented by A is $-SO_2R$.

Specific examples of the foregoing substituents will be given below, but the present invention is not limited thereto.

Specific examples of monovalent substituents represented by X, Y, and W include a hydrogen atom, a methyl group, an ethyl group, an n-propyl group, an isopropyl group, an n-butyl group, an isobutyl group, a sec-butyl group, a t-butyl group, a pentyl group, a hexyl group, an octyl group, a decyl group, a dodecyl group, an allyl group, a 2-butenyl group, a benzyl group, an α-dimethylbenzyl group, a methoxy group, an ethoxy group, a propyloxy group, a butyloxy group, an octyloxy group, a dodecyloxy group, a methoxyethoxy group, a phenoxyethoxy group, a methoxycarbonylethyl group, an ethoxycarbonylethyl group, a propyloxycarbonylethyl group, a butyloxycarbonylethyl group, an octyloxycarbonylethyl group, a phenoxycarbonylethyl group, a phenyl group, a tollyl group, a chlorine atom, a fluorine atom, and a bromine atom.

Specific examples of divalent substituents represented by X, Y and W include the following groups:

X: $-CH_2-$, $-CH_2-CH_2-$, $-O-CH_2-CH_2-O-$,
$-O-(CH_2)_8-O-$, $-O-C(=O)(CH_2)_4C(=O)-O-$

W: $-O-(CH_2)_6-O-$, $-O-CH_2-$ 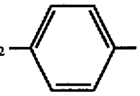 $-CH_2-O-$,
$-O-(CH_2)_2-O-(CH_2)_2-O-$, $-O-(CH_2)_2-S-(CH_2)_2-O-$ Y: $-O-CH_2-CH(CH_3)-O-$,
$-CH_2-CH_2-CO_2-(CH_2)_4-OCO-CH_2-CH_2-$,
$-CH_2-CH_2-CO_2-CH_2-CH_2-O-CH_2-CH_2-O-CO-CH_2-CH_2-$,
$-CH_2-CH_2-OCO-(CH_2)_8-CO_2-CH_2-CH_2-$,
$-CH_2-CH_2-CONH-(CH_2)_6-NHCO-CH_2-CH_2-$ Specific examples of the substituents represented by Z include a hydrogen atom, a chlorine atom, a methyl group, an ethyl group, a propyl group, a hexyl group, a methoxy group, an ethoxy group, a propyloxy group, and an octyloxy group.

Specific examples of monovalent substituents represented by A include a methanesulfonyl group, an ethanesulfonyl group, a butanesulfonyl group, a benzenesulfonyl group, a 4-methylbenzenesulfonyl group, a 2-mesitylenesulfonyl group, a 4-methoxybenzenesulfonyl group, a 4-octyloxybenzenesulfonyl group, a 2,4,6-triisopropylbenzenesulfonyl group, a β-styrenesulfonyl group, a vinylbenzenesulfonyl group, a 4-chlorobenzenesulfonyl group, a 2,5-dichlorobenzenesulfonyl group, a 2,4,5-trichlorobenzenesulfonyl group, a 1-naphthalenesulfonyl group, a 2-naphthalenesulfonyl group, a quinolinesulfonyl group, a thiophenesulfonyl group, an acetyl group, a propionyl group, a butyryl group, a pivaloyl group, a lauroyl group, a stearoyl group, a benzoyl group, a cinnamoyl group, a froyl group, a nicotinoyl group, a methoxycarbonyl group, an ethoxycarbonyl group, a phenoxycarbonyl group, a hexylaminocarbonyl group, a phenylaminocarbonyl group, a diphenylphosphoryl group, a diethylphosphoryl group, a 2-nitrobenzyl group, a 3,5-dimethoxybenzyl group, a 3,4,5-trimethoxybenzyl group, a trimethylsilyl group, a triethylsilyl group, a t-butyldimethylsilyl group, a diethylisopropylsilyl group, a dimethylphenylsilyl group, a diphenylmethylsilyl group, and a triphenylsilyl group.

Specific examples of divalent substituents represented by A include the following groups:

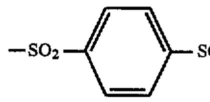, —CO—, —COCO—,

-continued $-CO-(CH_2)_8-CO-$, $-SO-$, $-SO_2-$

In the case where A is $-SiR_4R_5R_6$, a photo-excited acid generator may be used in combination to enhance photoreactivity. Examples of the photo-excited acid generator include an ammonium salt, a diazonium salt, an iodonium salt, a sulfonium salt, a phosphonium salt, and an onium salt. For the details of these photo-excited acid generators, reference can be made to *Imaging-you Yuki-kagaku Zairyou* (Organic Materials for Imaging), edited by Society for the Research of Organic Electronics Materials, 1993.

Specific examples of the compound represented by formula (1), (2), (3), or (4) of the present invention will be given, but the present invention should not be construed as being limited thereto. These compounds may be used singly or in admixture.

TABLE 1

Compounds of formula (1) (m = 1)

| Compound | A | X | W | Y | Z |
|---|---|---|---|---|---|
| (1) | 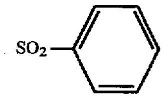 | H | H | $CH_3$ | H |
| (2) | 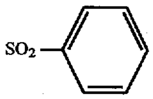 | H | H | $C_4H_9$(t) | H |
| (3) | 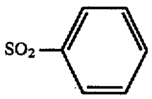 | H | H | $C_8H_{17}$(t) | H |
| (4) | 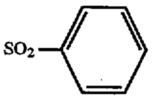 | H | H | $C_4H_9$(t) | Cl |
| (5) | 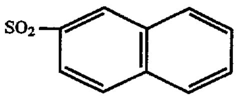 | H | H | $C_4H_9$(t) | H |
| (6) | 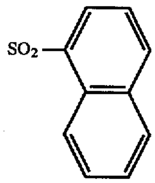 | H | H | $C_4H_9$(t) | H |
| (7) | 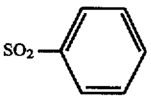 | $C_4H_9$(sec) | H | $C_4H_9$(t) | H |
| (8) | 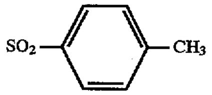 | $C_4H_9$(sec) | H | $C_4H_9$(t) | H |
| (9) | 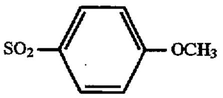 | $C_4H_9$(sec) | H | $C_4H_9$(t) | H |

TABLE 1-continued
| | | | | | |
|---|---|---|---|---|---|
| (10) | 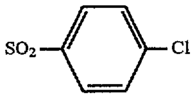 | $C_4H_9$(sec) | H | $C_4H_9$(t) | H |
| (11) | 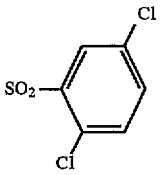 | $C_4H_9$(sec) | H | $C_4H_9$(t) | H |
| (12) | 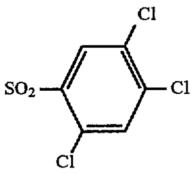 | $C_4H_9$(sec) | H | $C_4H_9$(t) | H |
| (13) | 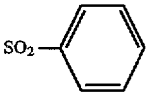 | $C_4H_9$(t) | H | $C_4H_9$(t) | H |
| (14) | 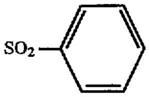 | $C_4H_9$(t) | H | $C_4H_9$(t) | Cl |
| (15) | 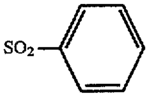 | $C_4H_9$(t) | H | $C_4H_9$(t) | $CH_3$ |
| (16) | 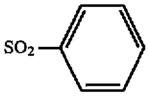 | $C_5H_{11}$(t) | H | $C_5H_{11}$(t) | H |
| (17) | 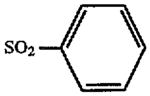 | $C_{12}H_{25}$ | H | $CH_3$ | H |
| (18) | 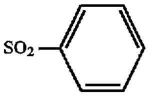 | H | $OC_8H_{17}$ | H | H |
| (19) | 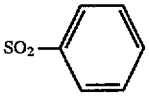 | H | H | $OCH_3$ | H |
| (20) | 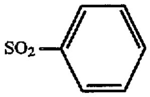 | $C_4H_9$(t) | H | $CH_2CH_2CO_2CH_3$ | H |
| (21) | 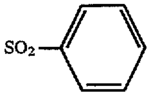 | $C_4H_9$(t) | H | $CH_2CH_2CO_2C_2H_5$ | Cl |
| (22) | 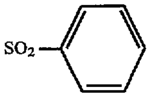 | $C_4H_9$(t) | H | $CH_2CH_2CO_2C_3H_7$ | Cl |

TABLE 1-continued
| | | | | | |
|---|---|---|---|---|---|
| (23) | 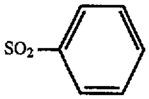 | $C_4H_9(t)$ | H | $CH_2CH_2CO_2C_8H_{17}$ | Cl |
| (24) | 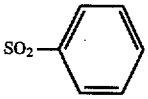 | $C_4H_9(t)$ | H | $CH_3$ | Cl |
| (25) | 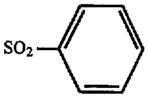 | $CH_2CH{=}CH_2$ | H | $C_4H_9(t)$ | H |
| (26) | 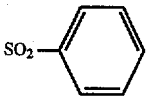 | $CH_2CH{=}CH_2$ | H | $C_4H_9(t)$ | Cl |
| (27) | 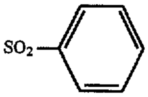 | $CH_2CH{=}CH_2$ | H | $C_8H_{17}(t)$ | Cl |
| (28) | $COCH_3$ | H | H | $C_4H_9(t)$ | Cl |
| (29) | 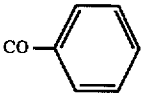 | $C_4H_9(t)$ | H | $C_4H_9(t)$ | Cl |
| (30) | $CO_2CH_3$ | 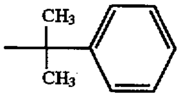 | H | 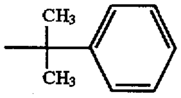 | H |
| (31) | $CO_2C_2H_5$ | $C_4H_9(t)$ | H | $C_4H_9(t)$ | $OCH_3$ |
| (32) | 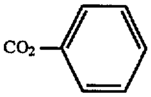 | $C_4H_9(t)$ | H | $CH_2CH_2CO_2C_8H_{17}$ | H |
| (33) | 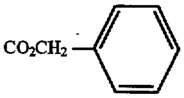 | $C_5H_{11}(t)$ | H | $C_5H_{11}(t)$ | H |
| (34) | 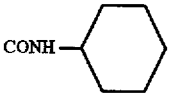 | $C_5H_{11}(t)$ | H | $C_5H_{11}(t)$ | H |
| (35) | 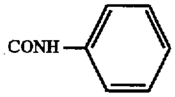 | $C_5H_{11}(t)$ | H | $C_5H_{11}(t)$ | H |
| (36) | $PO(OC_2H_5)_2$ | $C_5H_{11}(t)$ | H | $C_5H_{11}(t)$ | H |
| (37) | 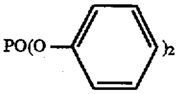 | $C_5H_{11}(t)$ | H | $C_5H_{11}(t)$ | H |
| (38) | 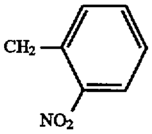 | $C_5H_{11}(t)$ | H | $C_5H_{11}(t)$ | H |

TABLE 1-continued
| | | | | | |
|---|---|---|---|---|---|
| (39) | 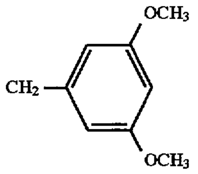 | $C_5H_{11}(t)$ | H | $C_5H_{11}(t)$ | H |
| (40) | $Si(CH_3)_3$ | $C_4H_9(sec)$ | H | $C_4H_9(t)$ | H |
| (41) | $Si(C_2H_5)_3$ | $C_4H_9(sec)$ | H | $C_4H_9(t)$ | H |
| (42) | $Si(CH_3)_2C_4H_9(t)$ | $C_4H_9(sec)$ | H | $C_4H_9(t)$ | H |
| (43) | 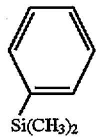 | $C_4H_9(sec)$ | H | $C_4H_9(t)$ | H |
| (44) | 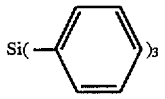 | H | H | $C_4H_9(t)$ | H |
| (45) | $Si(CH_3)_3$ | $C_4H_9(t)$ | H | $C_4H_9(t)$ | H |
Compound (46)
Compound of formula (1) (m = 2)
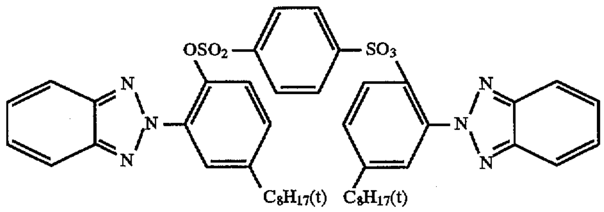
Compound (47)
Compound of formula (1) (m = 2)
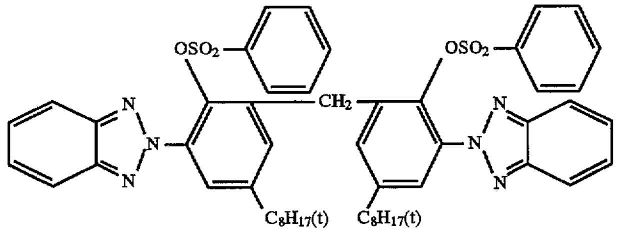
Compound (48)
Compound of formula (1) (m = 2)
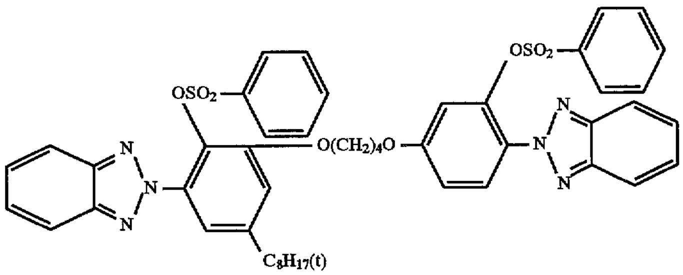

TABLE 1-continued

Compound (49)

Compound of formula (1) (m = 2)

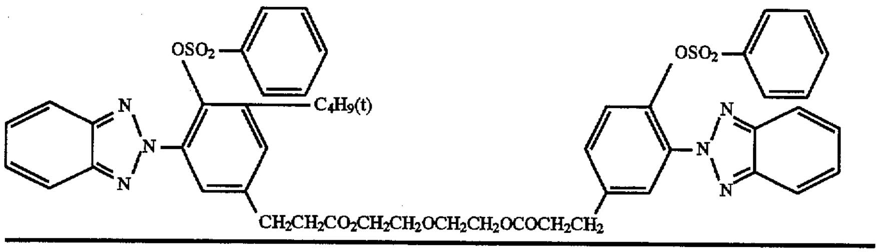

The compound represented by formula (1), (2), (3), or (4) of the present invention does not absorb fixing light when the heat-sensitive recording material is fixed but can absorb ultraviolet rays in a long wavelength range when exposed to light after the formation of image to stabilize the light stability of the image.

The incorporation of the compound represented by formula (1), (2), (3), or (4) of the present invention in the heat-sensitive recording material may be accomplished by various methods. For example, these compounds may be incorporated in the heat-sensitive recording material in the form of solid dispersion, emulsion dispersion, polymer dispersion, or latex dispersion. Alternatively, these compounds may be incorporated in the heat-sensitive recording material by encapsulating in microcapsules. Particularly preferred among these forms is microcapsules.

The compound represented by formula (1), (2), (3), or (4) of the present invention may be incorporated in any of an undercoating layer, the heat-sensitive recording layer, an interlayer, and the protective layer. Particularly preferred among these layers in which these compounds are incorporated is the protective layer. The content of the compounds of the present invention is preferably in the range of 0.05 to 3.0 $g/m^2$, and more preferably 0.1 to 2.0 $g/m^2$.

In order to effect emulsion dispersion, the compound represented by formula (1), (2), (3), or (4) is dissolved in an oil. The oil may normally stay solid or liquid or be in the form of polymer. Examples of such an oil include low boiling auxiliary solvents such as ether acetates, methylene chloride and cyclohexanones, ester phosphates, ester phthalates, ester acrylates, ester methacrylates, other carbonic esters, aliphatic amides, alkylated biphenyls, alkylated terphenyls, alkylene naphthalenes, diarylethanes, chlorinated paraffins, alcohols, phenols, ethers, monoolefins, and epoxy compounds. Specific examples of these oils include high boiling oils such as tricresyl phosphate, trioctyl phosphate, octyldiphenyl phosphate, tricyclohexyl phosphate, dibutyl phthalate, dioctyl phthalate, dilaurate phthalate, dicyclohexyl phthalate, butyl oleate, diethyleneglycol benzoate, dioctyl sebacate, dibutyl sebacate, dioctyl adipate, trioctyl trimellitate, acetyltriethyl citrate, octyl maleate, dibutyl maleate, isoamyl biphenyl, chlorinated paraffin, diisopropyl naphthalene, 1,1'-ditollylethane, 2,4-ditertiary amylphenol, N,N-dibutyl-2-butoxy-5-tertiary octylaniline, hydroxybenzoic acid 2-ethylhexylester, and polyethylene glycol. Particularly preferred among these high boiling oils are alcohols, ester phosphates, ester carboxylates, alkylated biphenyls, alkylated terphenyls, alkylated naphthalenes, and diarylethanes. To these high boiling oils, an oxidation inhibitor such as hindered phenol and hindered amine may be incorporated.

The oil solution comprising the compound of formula (1), (2), (3), or (4) dissolved therein is then added to an aqueous solution of a water-soluble high molecular compound. The mixture is then subjected to emulsion dispersion by means of a colloid mill, homogenizer or ultrasonic wave. Such a water-soluble high molecular compound may be used in combination with an emulsion or latex of a hydrophobic high molecular compound. Examples of the water-soluble high molecular compound include polyvinyl alcohol, silanol-modified polyvinyl alcohol, carboxy-modified polyvinyl alcohol, styrene-maleic anhydride copolymers, butadiene-maleic anhydride copolymers, ethylene-maleic anhydride copolymers, isobutylene-maleic anhydride copolymers, polyacrylamide, polystyrenesulfonic acid, polyvinyl pyrrolidone, ethylene-acrylic acid copolymers, and gelatin. Particularly preferred among these water-soluble high molecular compounds are polyvinyl alcohol and gelatin. Examples of the emulsion or latex of a hydrophobic high molecular compound include styrene-butadiene copolymers, carboxy-modified styrene-butadiene copolymers, and acrylonitrile-butadiene copolymers. If necessary, a known surface active agent may be added to the aqueous solution.

As the method for microcapsulation, any known microcapsulation method can be used. For example, the compound of formula (1), (2), (3), or (4) and a microcapsule wall precursor are dissolved in an organic solvent difficultly soluble or insoluble in water. The solution is then added to an aqueous solution of a water-soluble high molecular compound. The mixture is then subjected to emulsion dispersion by means of a homogenizer. The emulsion dispersion thus obtained is then heated to form a membrane at the oil-water interface so that a microcapsule wall is formed. Specific examples of the high molecular compound to be used as the microcapsule wall include polyurethane resins, polyurea resins, polyamide resins, polyester resins, polycarbonate resins, aminoaldehyde resins, melamine resins, polystyrene resins, styrene-acrylate copolymer resins, styrene-methacrylate copolymer resins, gelatin, and polyvinyl alcohol. Particularly preferred among these materials is polyurethane polyurea resins.

A microcapsule having a wall made of a polyurethane polyurea resin can be prepared by mixing a microcapsule wall precursor such as polyvalent isocyanate with a core to be capsulated, emulsion-dispersing the mixture in an aqueous solution of a water-soluble high molecular compound such as polyvinyl alcohol, and then raising the temperature of the solution so that a polymerization reaction occurs at the oil-water interface.

Specific examples of the polyvalent isocyanate compound include diisocyanates such as m-phenylenediisocyanate, p-phenylenediisocyanate, 2,6-tolylene diisocyanate, 2,4-tolylene diisocyanate, naphthalene-1,4-diisocyanate, diphenylmethane-4,4'-diisocyanate, 3,3'-diphenylmethane-4,4'-diisocyanate, xylene-1,4-diisocyanate, 4,4'-diphenylpropane diisocyanate, trimethylene diisocyanate, hexamethylene diisocyanate, propylene-1,2-diisocyanate, butylene-1,2-diisocyanate, cyclohexylene-1,2-diisocyanate and cyclohexylene-1,4-diisocyanate, triisocyanates such as 4,4',4"-triphenylmethane triisocyanate and toluene-2,4,6-triisocyanate, tetraisocyanates such as 4,4'-dimethyldiphenylmethane-2,2',5,5'-tetraisocyanate, and isocyanate prepolymers such as an adduct of hexamethylene diisocyanate and trimethylolpropane, an adduct of 2,4-tolylene diisocyanate and trimethylolpropane, an adduct of xylylene diisocyanate and trimethylolpropane, and an adduct of tolylene diisocyanate and hexanetriol. If necessary, two or more of these polyvalent isocyanates may be used in combination. Particularly preferred among these polyvalent isocyanates is one having three or more isocyanate groups per molecule.

The organic solvent in which the compound of formula (1), (2), (3), or (4) to be dissolved in the microcapsulation method may be the same oil as used in the emulsion dispersion method. The water-soluble high molecular compound may also be the same as used in the emulsion dispersion method.

The particle diameter of the microcapsule is preferably in the range of 0.1 to 1.0 μm, and more preferably 0.2 to 0.7 μm.

In the present invention, a compound known as a reducing agent may be used in combination with the compound of formula (1), (2), (3), or (4) to further eliminate discoloration upon exposure to light. The reducing agent may be present inside or outside the microcapsule when the microcapsule is used. In the latter case where the reducing agent is outside the microcapsule, the reducing agent penetrates into the microcapsule upon heat printing. Examples of the reducing agent include hydroquinone compounds, hydrazide compounds, hydroxyl compounds, phenidone compounds, catechol compounds, resorcinol compounds, hydroxyhydroquinone compounds, pyrrologlycinol compounds, phenol compounds, phenylhydrazide compounds, gallic acid compounds, ascorbic acid compounds, and ethylene glycol compounds, as described, e.g., in JP-A-3-191341 (The term "JP-A" as used herein means an "unexamined published Japanese patent application"), JP-A-3-25434, JP-A-1-252953, JP-A-2-302753, JP-A-1-129247, JP-A-1-227145, JP-A-1-243048, and JP-A-2-262649. Specific examples of these compounds include N-phenylacetohydrazide, N-phenylbutyrylhydrazide, p-t-butylphenol, 2-azidebenzooxazole, and the following compounds:

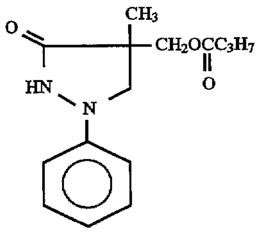
R-1

-continued

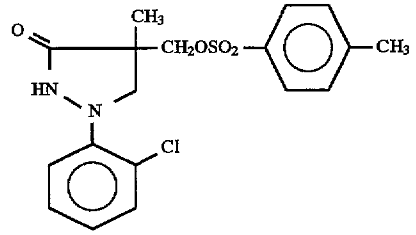
R-2

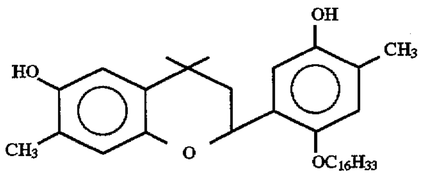
R-3

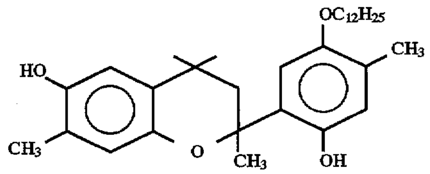
R-4

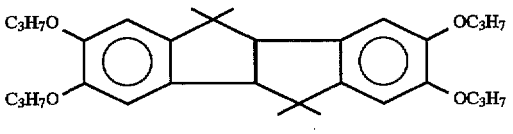
R-5

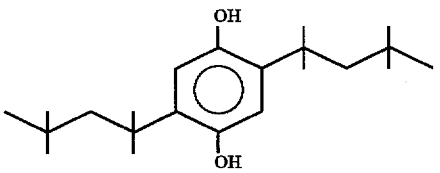
R-6

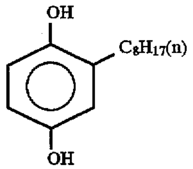
R-7

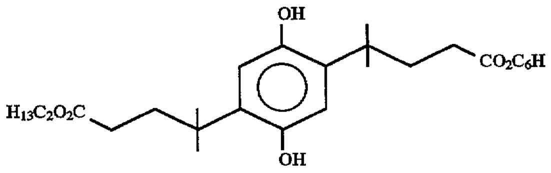
R-8

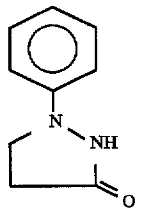
R-9

-continued

R-10

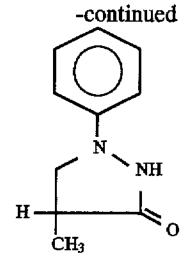

R-11

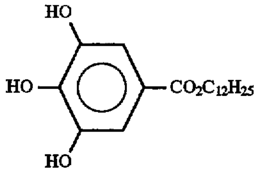

R-12

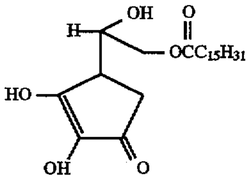

R-13

$CH_3(OCH_2CH_2)_3OCH_3$

R-14

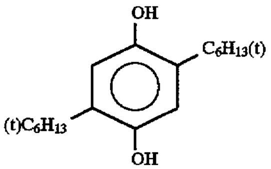

R-15

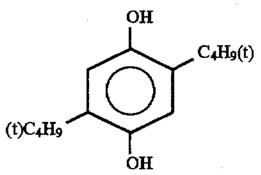

Known compounds may be used as the coloring components to be incorporated in the heat-sensitive recording layer. Preferably, the reaction of a diazonium salt compound with a coupler or the reaction of an electron donative colorless dye with an electron attractive compound is utilized. Particularly preferred among these reactions is the reaction of a diazonium salt compound with a coupler.

The heat-sensitive recording layer using the reaction of a diazonium salt compound with a coupler and the heat-sensitive recording layer using the reaction of an electron donative colorless dye with an electron attractive compound can be used in combination.

Examples of compounds to be incorporated in the heat-sensitive recording layer of the present invention include a diazonium salt compound, a coupler capable of reacting with said diazonium salt compound upon heating to produce a dye, and a basic substance (e.g., an organic base) which accelerates the reaction of said diazonium salt compound with said coupler.

The heat-sensitive recording layer using a diazonium salt compound and a coupler as coloring components preferably has a thickness of from 7 to 10 µm. The coated amount of the diazonium salt compound is generally 0.01 to 1.0 g/m$^2$, preferably from 0.1 to 0.3 g/m$^2$; the coated amount of the coupler is generally from 0.1 to 1.0 g/m$^2$, preferably from 0.2 to 0.6 g/m$^2$; and the coated amount of the basic substance is generally from 0.1 to 1.0 g/m$^2$, preferably from 0.3 to 0.6 g/m$^2$.

Examples of the diazonium salt compound is represented by the following formula.

$$Ar—N_2^+X^-$$

wherein Ar represents an aryl group; and $X^-$ represents an acid anion. The compound can control its maximum absorption wavelength by properly selecting the position and kind of substituents on Ar moiety.

Specific examples of the diazonium salt compound employable in the present invention include acid anion salts such as 4-(N-(2-(2,4-di-tert-amylphenoxy)butyryl)piperadino)benzenediazonium, 4-dioctylaminobenzenediazonium, 4-(N-(2-ethylhexanoyl)piperadino)benzenediazonium, 4-dihexylamino-2-hexyloxybenzenediazonium, 4-N-ethyl-N-hexadecylamino-2-ethoxybenzodiazonium, 3-chloro-4-dioctylamino-2-octyloxiobenzenediazonium, 2,5-dibutoxy-4-morpholinobenzenediazonium, 2,5-octoxy-4-morpholinobenzenediazonium, 2,5-dibutoxy-4-(N-(2-ethylhexanoyl)piperadino)benzenediazonium, 2,5-diethoxy-4-(N-(2-(2,4-di-tert-amylphenoxy)butyryl)piperadino)benzenediazonium, 2,5-dibutoxy-4-tollylthiobenzenediazonium, and 3-(2-octyloxyethoxy)-4-morpholinobenzenediazonium, and the following diazonium salt compounds D-1 to D-5. Particularly preferred among these diazonium salt compounds are hexafluorophosphates, tetrafluoroborates, and 1,5-naphthalenesulfonates.

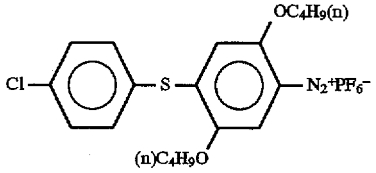

D-1

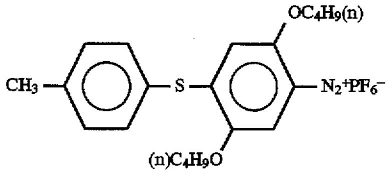

D-2

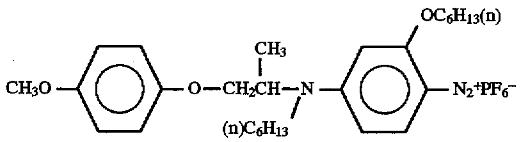

D-3

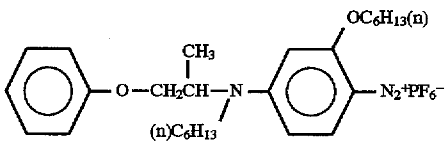

D-4

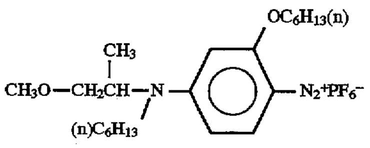

D-5

Particularly preferred examples of these diazonium salt compounds include 4-(N-(2-(2,4-di-tert-amylphenoxy)butyryl)piperadino)benzenediazonium, 4-dioctylaminobenzenediazonium, 4-(N-(2-ethylhexanoyl)piperadino)benzenediazonium, 4-dihexylamino-2-hexyloxybenzenediazonium, 4-N-ethyl-N-hexadecylamino-2-ethoxybenzodiazonium, 2,5-dibutoxy-4-(N-(2-ethylhexanoyl)piperadino)benzenediazonium, 2,5-diethoxy- 4-(N-(2-(2,4-di-tert-amylphenoxy)butyryl)piperadino) benzenediazonium, and the compounds D-3 to D-5, which undergo photodecomposition when exposed to light at a wavelength of 300 to 400 nm. The maximum absorption wavelength of the diazonium salt compound is determined by measuring the coat of the compound having a thickness of 0.1 to 1.0 g/$m^2$ by means of a spectrophotometer (Shimazu MPS-2000).

Examples of the coupler used in the present invention which reacts with the foregoing diazonium salt upon heating to exhibit a color include resorcinol, phloroglucinol, sodium 2,3-dihydroxynaphthalene-6-sulfonate, morpholinopropylamide 1-hydroxy-2-naphthoate, 1,5-dihydroxynaphthalene, 2,3-dihydroxynaphthalene, 2,3-dihydroxynaphthalene, 2,3-dihydroxy-6-sulfanylnaphthalene, anilide 2-hydroxy-3-naphthoate, ethanolamide 2-hydroxy-3-naphthoate, octylamide 2-hydroxy-3-naphthoate, 2-hydroxy-3-naphthoic acid-N-dodecyloxypropylamide, tetradecylamide 2-hydroxy-3-naphthoate, acetanilide, acetoacetanilide, benzoyl acetanilide, 2-chloro-5-octylacetoacetanilide, 1-phenyl-3-methyl-5-pyrazolone, 1-(2'-octylphenyl)-3-methyl-5-pyrazolone, 1-(2',4',6'-trichlorophenyl)-3-benzamide-5-pyrazolone, 1-(2',4',6'-trichlorophenyl)-3-anilino-5-pyrazolone, 1-phenyl-3-phenylacetamide-5-pyrazolone, and the following compounds C-1 to C-6. Two or more of these couplers may be used in combination to attain the desired color hue.

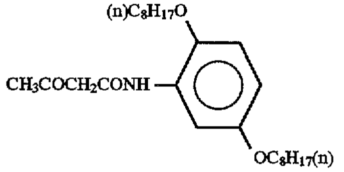
C-1

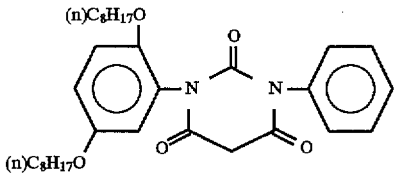
C-2

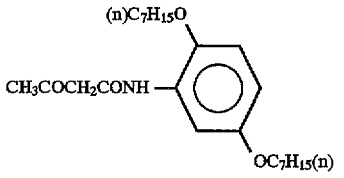
C-3

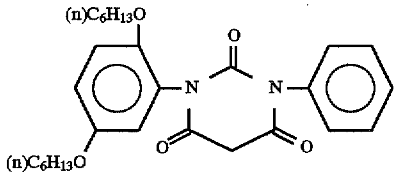
C-4

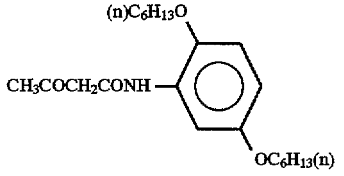
C-5

-continued

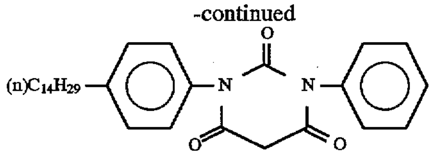
C-6

Examples of the basic substance include inorganic or organic basic compounds, and compounds which undergo decomposition or the like reactions upon heating to release an alkaline substance. Typical examples of these basic substances include nitrogen-containing compounds such as organic ammonium salts, organic amines, amides, ureas, thioureas, derivatives of ureas and thioureas, thiazoles, pyrroles, pyrimidines, piperazines, guanidines, indoles, imidazoles, imidazolines, triazoles, morpholines, piperidines, amidines, formamidines and pyridines. Specific examples of these nitrogen-containing compounds include tricyclohexylamine, tribenzylamine, octadecylbenzylamine, stearylamine, allylurea, thiourea, methylthiourea, allylthiourea, ethylenethiourea, 2-benzylimidazole, 4-phenylimidazole, 2-phenyl-4-methylimidazole, 2-undecylimidazoline, 2,4,5-trifuryl-2-imidazoline, 1,2-diphenyl-4,4-dimethyl-2-imidazoline, 2-phenyl-2-imidazoline, 1,2,3-triphenylguanidine, 1,2-dicyclohexylguanidine, 1,2,3-tricyclohexylguanidine, guanidine trichloroacetate, N,N'-dibenzylpiperadine, 4,4'-dithiomorpholine, morpholinium trichloroacetate, 2-aminobenzothiazole, and 2-benzoylhydrazinobenzothiazole. Two or more of these nitrogen-containing compounds may be used in combination.

The heat-sensitive recording layer using an electron donative colorless dye and an electron attractive compound as coloring components preferably has a thickness of from 5 to 9 μm. The coated amount the electron donative colorless dye is generally 0.1 to 0.5 g/$m^2$, preferably from 0.2 to 0.4 g/$m^2$; and the coated amount of the electron attractive compound is generally from 1.0 to 10.0 g/$m^2$, preferably from 3.0 to 5.0 g/$m^2$.

Examples of the electron donative colorless dye employable in the present invention include triarylmethane compounds, diphenylmethane compounds, thiazine compounds, xanthene compounds, and spiropyrane compounds. In particular, triarylmethane compounds and xanthene compounds are useful because they provide a high color density. Specific examples of these triarylmethane compounds and xanthene compounds include 3,3-bis(p-dimethylaminophenyl)-6-dimethylaminophthalide (i.e., crystal violet lactone), 3,3-bis(p-dimethylamino)phthalide, 3-(p-dimethylaminophenyl)-3-(1,3-dimethylindole-3-il) phthalide, 3-(p-dimethylaminophenyl)-3-(2-methylindole-3-il)phthalide, 3-(o-methyl-p-diethylaminophenyl)-3-(2-methylindole-3-il)phthalide, 4,4'-bis(dimethylamino) benzhydrinbenzylether, N-halophenyleucoauramine, N-2,4,5-trichlorophenylleucoauramine, rhodamine-B-anilinolactam, rhodamine(p-nitroanilino)lactam, rhodamine-B-(p-chloroanilino)lactam, 2-benzylamino-6-diethylaminofluoran, 2-anilino-6-diethylaminofluoran, 2-anilino-3-methyl-6-diethylaminofluoran, 2-anilino-3-methyl-6-cyclohexylmethylaminofluoran, 2-anilino-3-methyl-6-isoamylethylaminofluoran, 2-(o-chloroanilino)-6-diethylaminofluoran, 2-octylamino-6-diethylaminofluoran, 2-ethoxyethylamino-3-chloro-2-diethylaminofluoran, 2-anilino-3-chloro-6-diethylaminofluoran, benzoylleuco methylene blue, p-nitrobenzylleuco methylene blue, 3-methyl-spiro-dinaphthopyran, 3-ethyl-spiro-dinaphthopyran, 3,3'-dichloro-spiro-dinaphthopyran, 3-benzylspirodinaphthopyran, and 3-propyl-spiro-dibenzopyran.

Examples of the electron attractive compound include a phenol derivatives, salicylic acid derivatives, and hydroxybenzoic esters. In particular, bisphenols and hydroxybenzoic esters are preferred. Specific examples of these compounds include 2,2-bis(p-hydroxyphenyl)propane (i.e., bisphenol A), 4,4'-(p-phenylenediisopropyridene)diphenol (i.e., bisphenol P), 2,2-bis(p-hydroxyphenyl)pentane, 2,2-bis(p-hydroxyphenyl)ethane, 2,2-bis(p-hydroxyphenyl)butane, 2,2-bis(4'-hydroxy-3',5'-dichlorophenyl)propane, 1,1-(p-hydroxyphenyl)cyclohexane, 1,1-(p-hydroxyphenyl) propane, 1,1-(p-hydroxyphenyl)pentane, 1,1-(p-hydroxyphenyl)propane, 1,1-(p-hydroxyphenyl)pentane, 1,1-(p-hydroxyphenyl)-2-ethylhexane, 3,5-di(α-methylbenzyl)salicylic acid, polyvalent metal salts thereof, 3,5-di(tert-butyl)salicylic acid, polyvalent metal salts thereof, 3-α,α-dimethylbenzylsalicylic acid, polyvalent metal salts thereof, p-hydroxybenzoic butyl, p-hydroxybenzoic benzyl, p-hydroxybenzoic acid-2-ethylhexyl, p-phenylphenol, and p-cumylphenol.

The heat-sensitive recording layer (e.g., those using the reaction of a diazonium salt compound with a coupler and those using the reaction of an electron donative colorless dye with an electron attractive compound) of the present invention may contain a sensitizer.

Examples of the sensitizer include a low boiling organic compound appropriately having an aromatic group and a polar group in its molecule. Examples thereof p-benzyloxybenzoic benzyl, α-naphthylbenzyl ether, β-napthylbenzyl ether, β-naphthoic phenyl ester, α-hydroxy-β-naphthoic phenyl ester, β-naphthol-(p-chlorobenzyl)ether, 1,4-butanediolphenyl ether, 1,4-butanediol-p-methylphenyl ether, 1,4-butanediol-p-ethylphenyl ether, 1,4-butanediol-m-methylphenyl ether, 1-phenoxy-2-(p-tollyloxy)ethane, 1-phenoxy-2-(p-ethylphenoxy)ethane, 1-phenoxy-2-(p-chlorophenoxy) ethane, and p-benzylbiphenyl.

In the present invention, a method for incorporating the diazonium salt compound, the coupler which reacts with the diazonium salt compound upon heating to exhibit a color, the basic substance, the electron donative colorless dye, the electron attractive compound, and the foregoing sensitizer in the heat-sensitive recording material of the present invention is not specifically limited. For example, these compounds may be incorporated in the heat-sensitive recording layer in the form of solid dispersion, emulsion dispersion, polymer dispersion, latex dispersion or microcapsulated form, as in the case of the compound of formula (1), (2), (3), or (4). Particularly preferred among these forms is the microcapsule form from the standpoint of preservability. In the coloring system utilizing the reaction of a diazonium salt compound with a coupler, the diazonium salt compound is preferably encapsulated in microcapsules. In the coloring system utilizing the reaction of an electron donative colorless dye with an electron attractive compound, the electron donative colorless dye is preferably encapsulated in microcapsules.

In the present invention, the foregoing heat-sensitive recording layer may comprise plurality of heat-sensitive recording layers. The various heat-sensitive recording layers may have different color hues to provide a multi-color heat-sensitive recording material. The layer constitution is not specifically limited.

A preferred layer constitution comprises a heat-sensitive recording layer A comprising an electron donative dye and an electron attractive compound, and a heat-sensitive recording layer B comprising a diazonium salt compound and couplers which exhibit colors by reacting with the diazonium salt compound.

A particularly preferred layer constitution is a multi-color heat-sensitive recording material comprising two heat-sensitive recording layers having diazonium salt compounds sensitive to different wavelength ranges and couplers which react with the respective diazonium salt compound upon heating to exhibit different color hues, respectively, in combination and a heat-sensitive recording layer comprising an electron donative colorless dye and an electron attractive compound in combination. For example, the layer constitution may comprise a first heat-sensitive recording layer A comprising an electro donative dye, preferably an electron donative colorless dye, and an electron attractive compound on a support, a second heat-sensitive recording layer B comprising a diazonium salt compound having a maximum absorption wavelength of 360±20 nm and a coupler which reacts with the diazonium salt compound upon heating to exhibit a color, and a third heat-sensitive recording layer C comprising a diazonium salt compound having a maximum absorption wavelength of 400±20 nm and a coupler which reacts with the diazonium salt compound upon heating to exhibit a color. In this embodiment, the color hue of the various heat-sensitive recording layers may be subtractive primaries, i.e., yellow, magenta and cyan to provide full-color image recording.

In the method for recording on the above multi-color heat-sensitive recording material, the third heat-sensitive recording layer is first heated to cause the diazonium salt compound and the coupler contained therein to exhibit a color. The multi-layer heat-sensitive recording material is then irradiated with light of 400±20 nm so that the unreacted diazonium salt compound contained in the third heat-sensitive recording layer is decomposed. The multi-color heat-sensitive recording material is then heated to cause the second heat-sensitive recording layer to exhibit a color so that the diazonium salt compound and the coupler contained therein exhibit a color. During this process, although the third heat-sensitive recording layer is heated at the same time, since the diazonium salt compound contained in the third heat-sensitive recording layer has already been decomposed and lost its coloring ability, it does not exhibit any color. The multi-color heat-sensitive recording material is then irradiated with light of 360±20 nm so that the diazonium salt compound contained in the second heat-sensitive recording layer is decomposed. Finally, the multi-color heat-sensitive recording layer is heated to cause the first heat-sensitive recording layer to exhibit a color. During this process, although the second and third heat-sensitive recording layers are heated at the same time, since the diazonium salt compounds contained in these heat-sensitive recording layers have already been decomposed and lost its coloring ability, they do not exhibit any color.

In the present invention, the known oxidation inhibitors may be used to further improve the light resistance of the heat-sensitive recording material. Examples thereof include oxidation inhibitors as disclosed in EP-A-310551, DE-A-3435443, EP-A-310552, JP-A-3-121449, EP-A-459416, JP-A-2-262654, JP-A-2-71262, JP-A-63-163351, U.S. Pat. No. 4,814,262, JP-A-54-48535, JP-A-5-61166, JP-A-5-119449, U.S. Pat. No. 4,980,275, JP-A-63-113536, JP-A-62-262047, EP-A-223739, EP-A-309402, and EP-A-309401. Specific examples of the oxidation inhibitors will be given below.

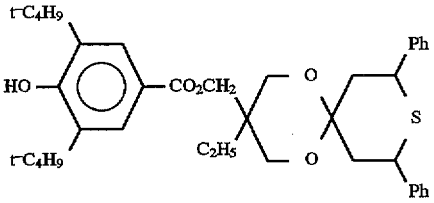
Q-1
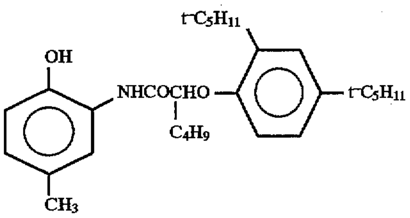
Q-2
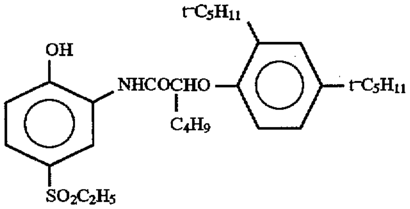
Q-3
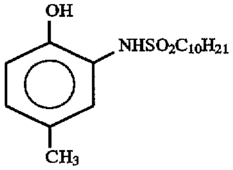
Q-4
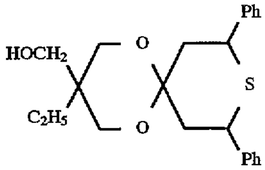
Q-5
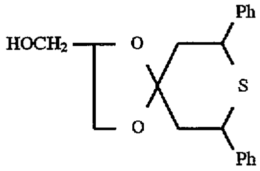
Q-6
Combination of
Q-7
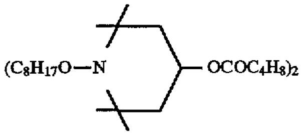
and
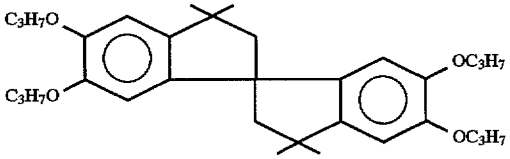

-continued
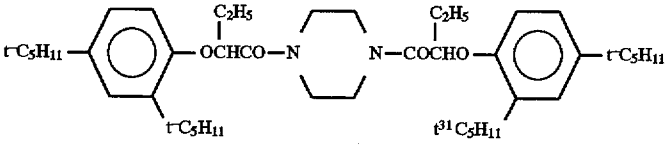
Q-8
Q-9
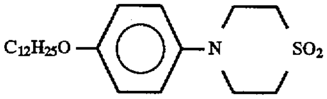
Q-10
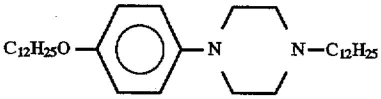
Q-11
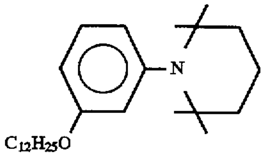
Q-12
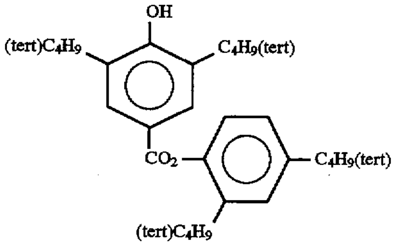
Q-13
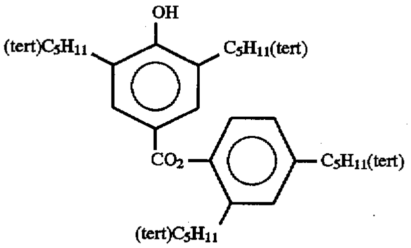
Q-14
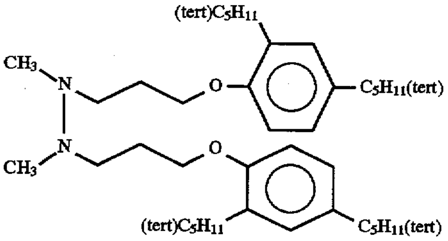
Q-15
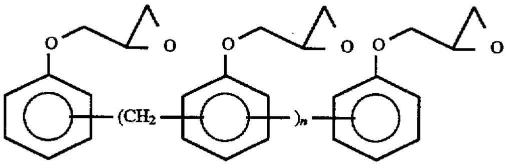
Q-16

-continued
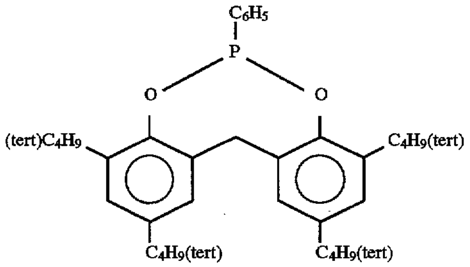
Q-17
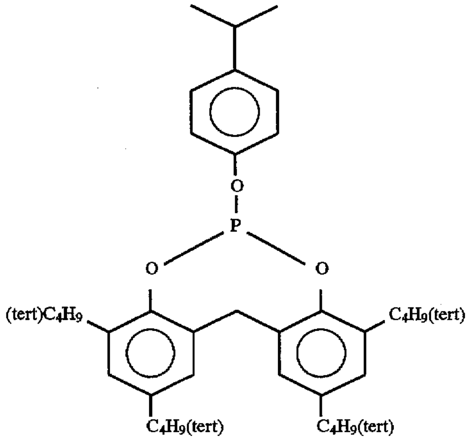
Q-18
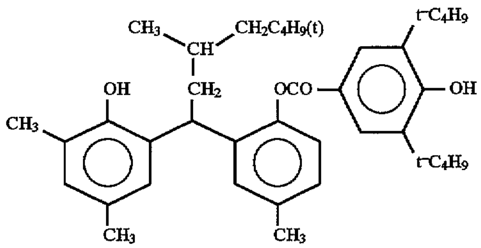
Q-19
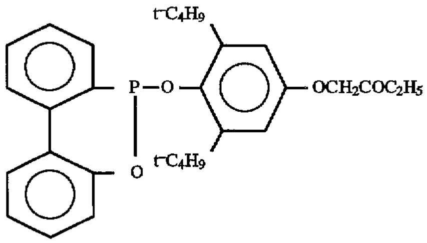
Q-20
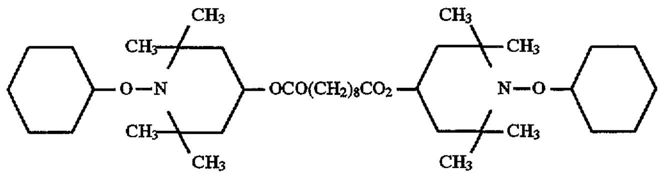
Q-21
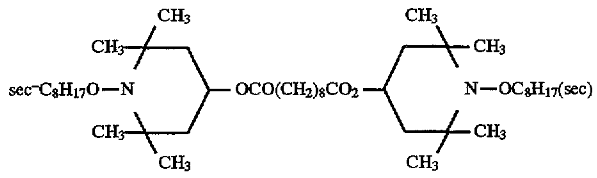
Q-22

-continued

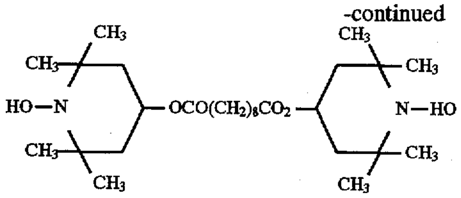

Q-23

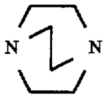

Q-24

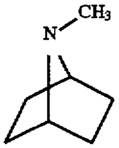

Q-25

$(C_{14}H_{29}OCOCH_2CH_2)_2S$ Q-26

$(C_{18}H_{27}OCOCH_2CH_2)_2S$ Q-27

$(C_{12}H_{25}SCH_2CH_2CO_2CH_2)_4C$ Q-28

Further, various additives known in the field of heat-sensitive recording material and pressure-sensitive recording material are useful. Specific examples of the oxidation inhibitors include compounds as disclosed in JP-A-60-125470, JP-A-60-125471, JP-A-60-125472, JP-A-60-287485, JP-A-60-287486, JP-A-60-287487, JP-A-62-146680, JP-A-60-287488, JP-A-62-282885, JP-A-63-89877, JP-A-63-88380, JP-A-63-088381, JP-A-01-239282, JP-A-04-291685, JP-A-04-291684, JP-A-05-188687, JP-A-05-188686, JP-A-05-110490, JP-A-05-1108437, JP-A-05-170361, JP-A-63-203372, JP-A-63-224989, JP-A-63-267594, JP-A-63-182484, JP-A-60-107384, JP-A-60-107383, JP-A-61-160287, JP-A-61-185483, JP-A-61-211079, JP-A-63-251282, JP-A-63-051174, JP-B-48-043294 (The term "JP-B" as used herein means an "examined Japanese patent publication"), and JP-B-48-033212.

Specific examples of these compounds include 6-ethoxy-1-phenyl-2,2,4-trimethyl-1,2-dihydroquinoline, 6-ethoxy-1-octyl-2,2,4-trimethyl-1,2-dihydroquinoline, 6-ethoxy-1-phenyl-2,2,4-trimethyl-1,2,3,4-tetrahydroquinoline, 6-ethoxy-1-octyl-2,2,4-trimethyl-1,2,3,4-tetrahydroquinoline, nickel cyclohexanate, 2,2-bis-4-hydroxyphenylpropane, 1,1-bis-4-hydroxyphenyl-2-ethylhexyl, 2-methyl-4-methoxy-diphenylamine, 1-methyl-2-phenylindole, and the following compounds:

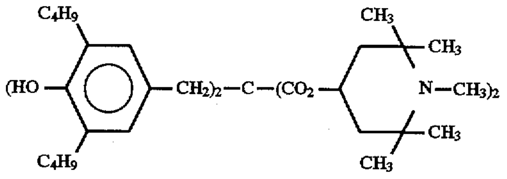

Q-29

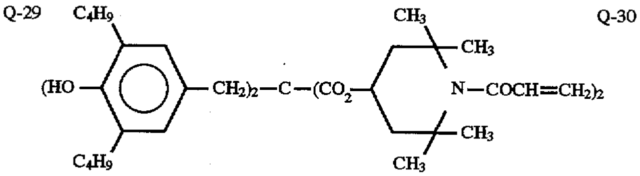

Q-30

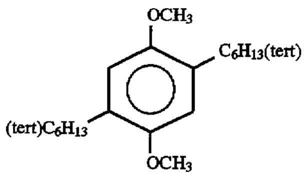

Q-31

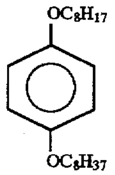

Q-32

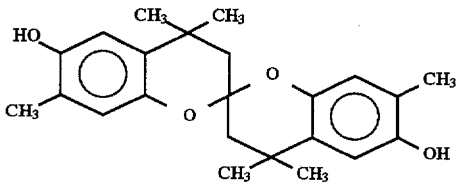

Q-33

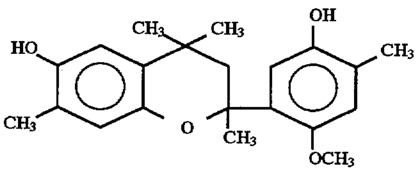

Q-34

-continued
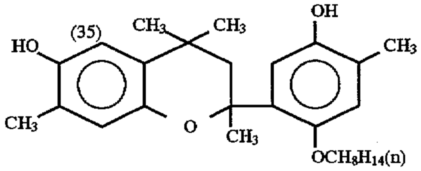
Q-35
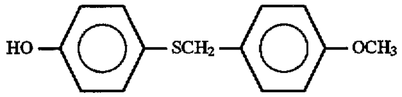
Q-36
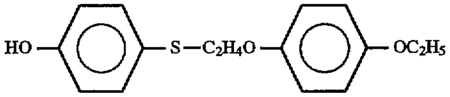
Q-37
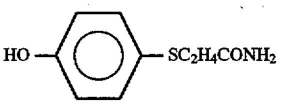
Q-38
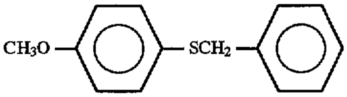
Q-39
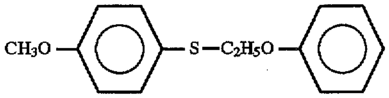
Q-40
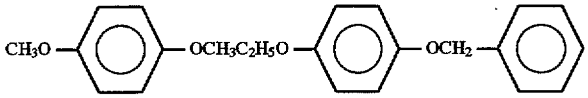
Q-41
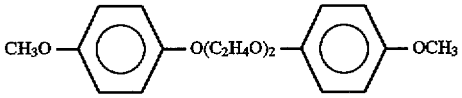
Q-42
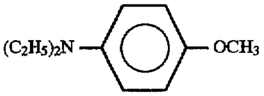
Q-43
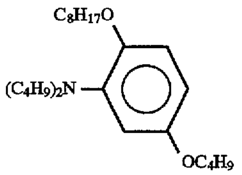
Q-44
Combination of
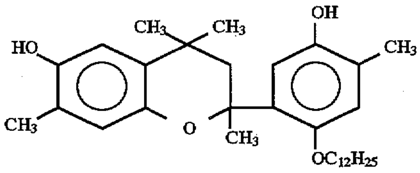
and
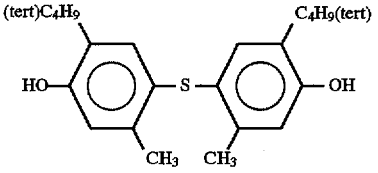
Q-45
Combination of
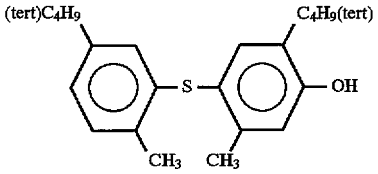
and hydroquinone ether
Q-46
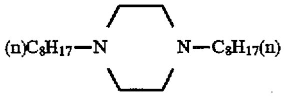
Q-47
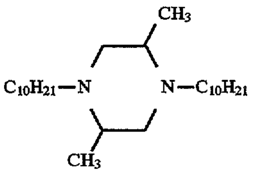
Q-48
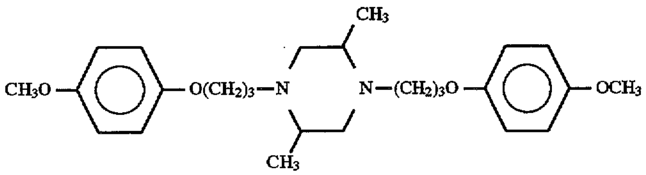
Q-49

-continued

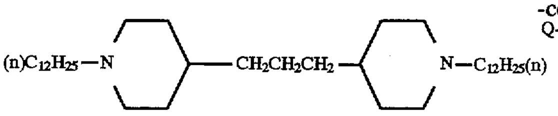

Q-50

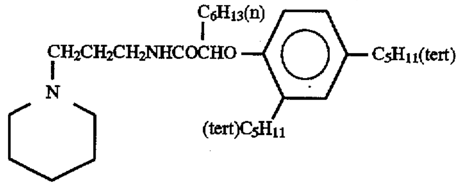

Q-51

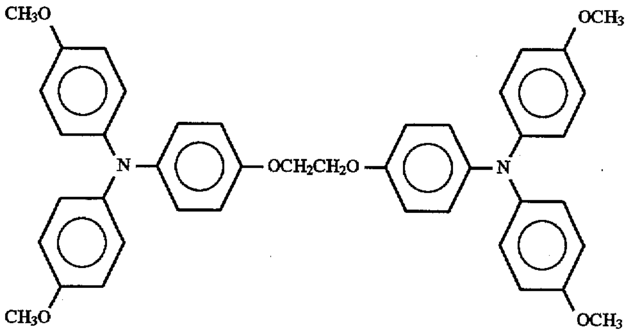

Q-52

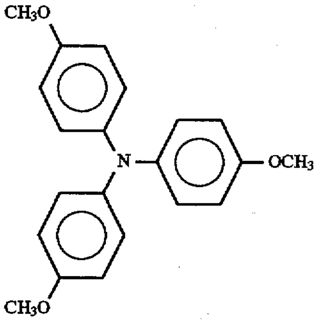

Q-53

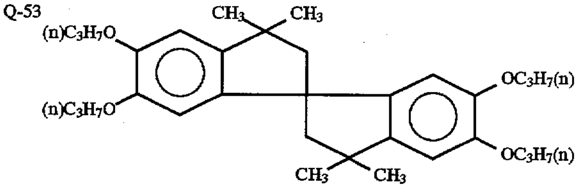

Q-54

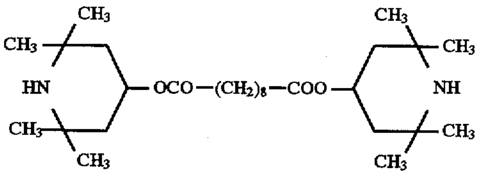

Q-55

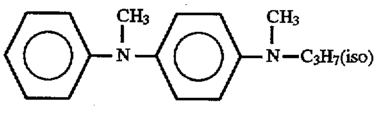

Q-56

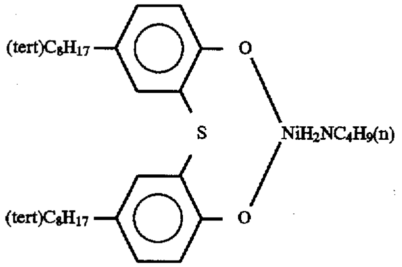

Q-57

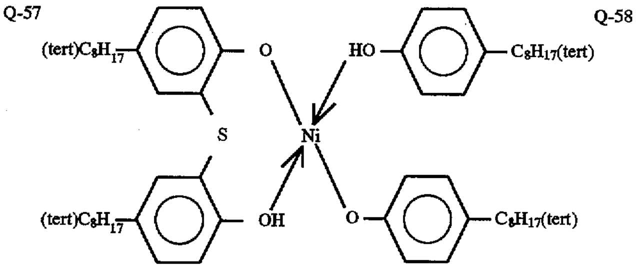

Q-58

These oxidation inhibitors may be incorporated in the heat-sensitive recording layer, the interlayer, and the protective layer. In the case where these oxidation inhibitors are used in combination, examples of the combination include a combination of (Q-7), (Q-45), and (Q-46) and a combination of (Q-10) and (Q-13).

FIG. 1 shows a schematic sectional view of the heat-sensitive recording material according to one embodiment of the present invention, which comprises a support 1 having thereon, in this sequence, a heat-sensitive recording layer 2 and a protective layer 3.

Figure 2:
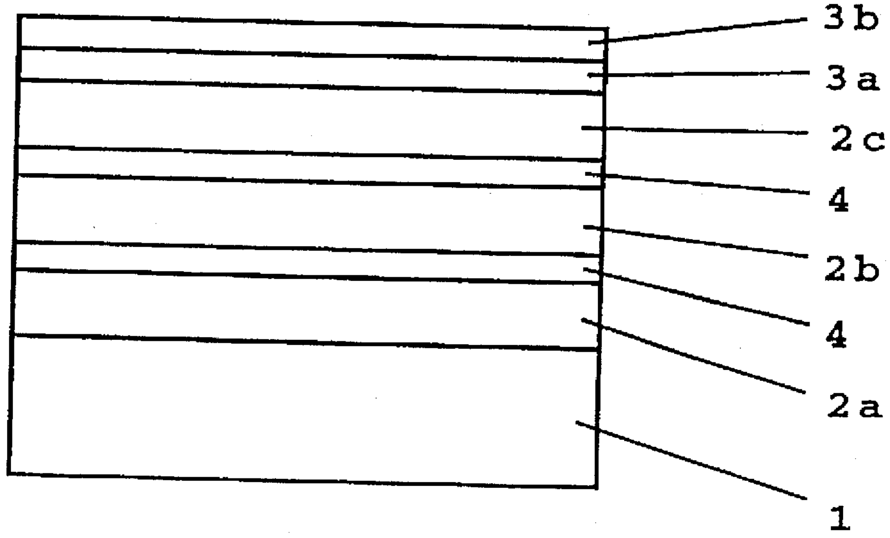
FIG. 2 shows a schematic sectional view of the heat-sensitive recording material according to a preferred embodiment of the present invention.

FIG. 2 shows a schematic sectional view of the heat-sensitive recording material according to a preferred embodiment of the present invention, which comprises a support 1 having thereon, in this sequence, a first heat-sensitive recording layer 2*a* containing an electron donative colorless dye and an electron attractive compound, an interlayer 4, a second heat-sensitive recording layer 2*b* containing a diazonium salt compound and a coupler, an interlayer 4, a third heat-sensitive recording layer 2*c* containing a diazonium salt compound and a coupler, a first protective layer 3*a*, and a second protective layer 3*b*.

The layers constituting the heat-sensitive recording material of the present invention may comprise a binder. Any known binders can be used as the binder employable in the present invention. For example, a water-soluble high molecular compound such as polyvinyl alcohol and gelatin or polymer latex may be used.

Examples of the support employable in the present invention include a plastic film, paper, plastic resin-laminated paper, synthetic paper or the like.

In the present invention, if heat-sensitive recording layers having different color hues are used in combination, an interlayer may be provided between the heat-sensitive recording layers to inhibit color stain. The interlayer can be produced by known methods. The interlayer may comprise, as a major component, a water-soluble high molecular compound such as polyvinyl alcohol, gelatin, modified polyvinyl alcohol (e.g., silanol-modified polyvinyl alcohol and carboxyl-modified polyvinyl alcohol), styrene-maleic anhydride copolymers, and polyvinyl pirrolidone, with polyvinyl alcohol and gelatin being preferred, which may contain a crosslinking agent such as glyoxal, boric acid, and polyamide epichlorohydrin. The interlayer may further comprise various known additives such as a surfactant. The thickness of the interlayer is generally from 5 to 9 µm.

The protective layer of the present invention can be produced by know methods. The protective layer may comprise, as a major component, a water-soluble high molecular compound such as polyvinyl alcohol, gelatin, modified polyvinyl alcohol (e.g., silanol-modified polyvinyl alcohol and carboxyl-modified polyvinyl alcohol), styrene-maleic anhydride copolymers, and polyvinyl pirrolidone, with polyvinyl alcohol and carboxyl-modified polyvinyl alcohol being preferred, which may contain a crosslinking agent such as glyoxal, boric acid, and polyamide epichlorohydrin. The protective layer may further comprise various known additives such as a pigment and a surfactant. The thickness of the protective layer is generally from 0.5 to 4.0 µm. The protective layer may comprise two separate protective layers as shown in FIG. 2. In this case, the compound represented by formula (1), (2), (3), or (4) is preferably contained in the first protective layer 3*a* in FIG. 2.

The undercoating layer, which may have any known constitution and can be produced by any know method, may be provided between the support and the heat-sensitive recording layer. The undercoating layer may comprise, as a major component, a water-soluble high molecular compound such as polyvinyl alcohol, gelatin, modified polyvinyl alcohol (e.g., silanol-modified polyvinyl alcohol and carboxyl-modified polyvinyl alcohol), styrene-maleic anhydride copolymers, and polyvinyl pirrolidone, with polyvinyl alcohol and gelatin being preferred, which may contain a crosslinking agent such as glyoxal, boric acid, and polyamide epichlorohydrin. The undercoating layer may further comprise various known additives such as a surfactant.

The present invention will be further described in the following examples, but the present invention should not be construed as being limited thereto.

The "parts" as used hereinafter indicates "parts by weight".

The reflection density was determined by means of a reflection densitometer RD918 available from Macbeth Corp. For the evaluation of the light fixability of the diazo heat-sensitive recording layer, a heat of 86 mJ/mm$^2$ was again applied to the non-printed area after fixing by irradiation with light for a predetermined period of time to see that it is not colored (i.e., it is fixed).

The evaluation of light resistance was made on specimens which had been irradiated with light of 0.9 W/m$^2$ for 48 hours. A weathermometer CI 65 (available from Atlas Electric Devices Co., Ltd.) was used. The light resistance of the non-printed area was evaluated by the reflection density (yellow component) thereof. For the evaluation of light resistance of the image area, the percent residual density thereon was determined by the equation:

$$\text{Residual density (\%)} = \frac{\text{Reflection density after irradiation with fluorescent light}}{\text{Reflection density before irradiation with fluorescent light}} \times 100$$

EXAMPLE 1

Preparation of coating solution of protective layer containing compound of formula (1), (2), (3), or (4)

5.3 parts of Compound (3) were mixed with 6.6 parts of ethyl acetate and 2.9 parts of ester phthalate A-1 shown below. 2.0 parts of a xylylene diisocyanate/trimethylol propane adduct (75% ethyl acetate solution; Takenate D110N, available from Takeda Chemical Industries, Ltd.) as a capsule wall material were then added to the solution. The mixture was then stirred to prepare a uniform solution. Separately, 60 parts of a 10 wt % aqueous solution of polyvinyl alcohol (PVA217E, available from Kuraray Co., Ltd.) comprising 3.2 parts of a 10 wt % aqueous solution of sodium dodecylsulfonate incorporated therein were prepared. To the aqueous solution was then added the foregoing solution. The mixture was then subjected to emulsion dispersion by means of a homogenizer. The resulting emulsion was heated with stirring to a temperature of 50° C. where it was allowed to undergo capsulation reaction for 3 hours to obtain the desired capsule solution. The average particle diameter of the capsules was 0.2 µm. To 13 parts of the capsule solution were then added 50 parts of ion-exchanged water. The mixture was then homogenized to prepare the desired coating solution.

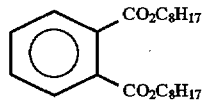

A-1

Preparation of coating solution of heat-sensitive recording layer (Preparation of capsule solution of diazonium salt compound)

2.8 parts of Compound a-1 having a maximum absorption wavelength of 365 nm as a diazonium salt compound, 2.8 parts of dibutyl sulfate, 0.56 parts of 2,2-dimethoxy-1,2-diphenylethane-1-one (Ilgacure 651, available from Ciba Geigy) were dissolved in 19.0 parts of ethyl acetate. To the solution were then added 5.9 parts of isopropylbiphenyl and 2.5 parts of tricresyl as high boiling solvents. The mixture was then heated with stirring to prepare a uniform solution. To the solution were then added 7.6 parts of a xylylene diisocyanate/trimethylolpropane adduct (75% ethyl acetate solution; Takenate D110N, available from Takeda Chemical Industries, Ltd.) as a capsule wall material. The mixture was then homogenized. Separately, 64 parts of a 6 wt % aqueous solution of gelatin (MGP-9066, available from Nippi Gelatin Kogyo K.K.) comprising 2.0 parts of a 10 wt % aqueous solution of sodium dodecylsulfonate were prepared. To the solution was then added the foregoing diazonium salt compound solution. The mixture was then subjected to emulsion dispersion by means of a homogenizer. To the resulting emulsion were then added 20 parts of water. The mixture was then homogenized. The emulsion was heated with stirring to a temperature of 40° C. where it was allowed to undergo capsulation reaction for 3 hours. Thereafter, the reaction solution was cooled to a temperature of 35° C. To the reaction solution were then added 6.5 parts of an ion-exchanging resin Amberlite IRA68 (available from Organo Corp.) and 13 parts of an ion-exchanging resin Amberlite IRC50 (available from Organo Corp.). The mixture was then stirred for 1 hour. The ion-exchanging resins were then removed by filtration to obtain the desired capsule solution. The average particle diameter of the capsules was 0.64 μm.

a-1

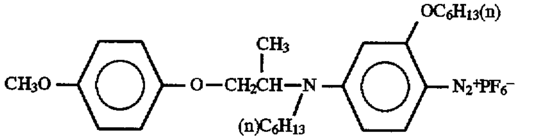

(Preparation of emulsion dispersion of coupler)

3.0 parts of Compound b-1 shown below as a coupler, 4.0 parts of triphenylguanidine, 4.0 parts of 1,1-(p-hydroxyphenyl)-2-ethylhexane, 8.0 parts of 4,4'-(p-phenylenediisopropylidene)diphenol, 8.0 parts of 2-ethylhexyl-4-hydroxybenzoate, 2.0 parts of Compound b-2 as an oxidation inhibitor, and 2.0 parts of 1,1,3-tris(2-methyl-4-hydroxy-5-t-butylphenyl)butane were dissolved in 10.5 parts of ethyl acetate. To the solution were then added 0.48 parts of tricresyl phosphate, 0.24 parts of diethyl maleate and 1.27 parts of Pionion A41C (available from Takemoto Yushi K.K.) as high boiling solvents. The mixture was then heated and homogenized. The solution was then added to 93 parts of a 8 wt % aqueous solution of gelatin (#750 gelatin, available from Shinden Gelatin K.K.) which had been separately prepared. The mixture was then subjected to emulsion dispersion by means of a homogenizer. The remaining ethyl acetate was then evaporated from the solution to obtain the desired emulsion dispersion.

(Preparation of coating solution)

The foregoing capsule solution of diazonium salt compound, the foregoing emulsion dispersion of coupler and a styrene-butadiene rubber (SBR:SN307, available from Sumitomo Norgatac K.K.) were mixed in such an amount that the proportion of diazonium salt compound/coupler and diazonium salt compound/styrene-butadiene rubber were 1/2 and 1/6.4, respectively, to prepare the desired coating solution.

b-1

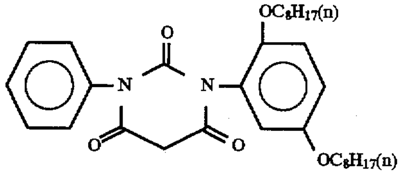

b-2

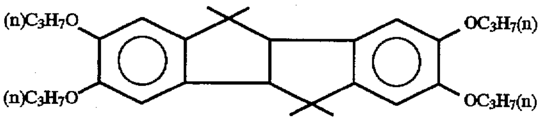

Preparation of coating solution of other protective layer

To 61 parts of a 5.0 wt % itaconic acid-modified polyvinyl alcohol (KL-318, available from Kuraray Co., Ltd.) were added 2.0 parts of a 20.5 wt % dispersion of lead stearate (Hydrin F115, available from Chukyo Yushi K.K.). To the mixture were then added 8.4 parts of a 8.4 wt % aqueous solution of Compound c-1, 8.0 parts of ME-313 (available from Daikin K.K.) as a fluorine release agent, and 0.5 parts of KF-4 (available from Kagoshima Denpun K.K.) as a flour starch. The mixture was then homogenized. This solution was used later as a mother liquor. Separately, 12.5 parts of a 20 wt % aqueous solution of Kaogloss (available from Shiraishi Kogyo K.K.) which had been ion-exchanged, 0.06 parts of Poise 532A (available from Kao Corp.), 1.87 parts of Hydrin Z-7 (available from Chukyo Yushi K.K.), 1.25 parts of a 10 wt % polyvinyl alcohol (PVA105, available from Kuraray Co., Ltd.), and 0.39 parts of a 2 wt % aqueous solution of sodium dodecylsulfonate were mixed. The mixture was then subjected to fine dispersion by means of a dinomill. This dispersion was used later as a pigment solution. To 80 parts of the mother liquor were then added 4.4 parts of the pigment solution. The mixture was then stirred for not less than 30 minutes. To the mixture were then added 2.8 parts of Wetmaster 500 (available from Toho Kagaku K.K.). The mixture was then stirred for not less than 30 minutes to obtain the desired coating solution.

c-1

$C_{12}H_{25}O(CH_2CH_2O)H$

Preparation of heat-sensitive recording material

Onto a support for photographic paper comprising a polyethylene laminated on a high quality paper was sequentially coated the heat-sensitive recording layers, the protective layer containing the compound of formula (1), (2), (3), or (4), and other protective layers by means of a mayor bar. The material was then dried to obtain the desired heat-sensitive recording material. The coated amount of these layers were 8.33 g, 2.50 g, and 1.23 g per $m^2$, respectively, as calculated in terms of solid content.

Heat-sensitive recording

Using a thermal head KST available from Kyocera Corp., printing was made on the foregoing heat-sensitive recording material with a recording pulsed signal whose width and voltage applied to the thermal head are determined such that the recording energy per unit area is 62 $mJ/mm^2$. As a result, the printed area was colored magenta. The heat-sensitive recording material was then subjected to light from an ultraviolet light at a luminescence center wavelength of 365 nm and an output of 40 W for 15 seconds so that printing was fixed.

EXAMPLE 2

A heat-sensitive recording material was prepared and evaluated in the same manner as in Example 1 except that Compound (23) was used instead of Compound (3) and tricresyl phosphate was used instead of A-1.

EXAMPLE 3

A heat-sensitive recording material was prepared and evaluated in the same manner as in Example 1 except that the protective layer containing the compound of formula (1), (2), (3), or (4) was replaced by the following protective layer.

Preparation of emulsion dispersion for protective layer containing the compound of formula (1), (2), (3), or (4)

5.3 parts of Compound (21) were mixed with 6.6 parts of ethyl acetate and 2.9 parts of Compound A-1. Separately, 83 parts of a 12 wt % aqueous solution of gelatin (#750, available from Shinden Gelatin K.K.) comprising 8.4 parts of a 10% aqueous solution of sodium dodecylsulfonate incorporated therein was prepared. To the aqueous solution were then added the foregoing solution of Compound (12). The mixture was then subjected to emulsion dispersion by means of a homogenizer. 37.5 parts of the emulsion dispersion thus prepared were then added 133 parts of a 2.5 wt % aqueous solution of gelatin (#750, available from Shinden Gelatin K.K.) comprising 4.2 parts of a 10% aqueous solution of sodium dodecylsulfonate incorporated therein. The mixture was then homogenized to obtain the desired coating solution.

EXAMPLE 4

A heat-sensitive recording material was prepared and evaluated in the same manner as in Example 2 except that 5.3 parts of Compound (7) were used instead of Compound (23) and 1.3 parts of Compound (R-6) were used as a reducing agent.

EXAMPLE 5

A heat-sensitive recording material was prepared and evaluated in the same manner as in Example 1 except that the following leuco type heat-sensitive recording layer B was provided between the support and the diazo heat-sensitive recording layer (hereinafter referred to as "heat-sensitive recording layer A"), the following interlayer 1 was provided between the two heat-sensitive recording layers, and Compound (40) was used instead of Compound (3).

Preparation of coating solution of heat-sensitive recording layer B (Preparation of capsule solution of electron donative dye precursor)

0.39 parts of 3-(o-methyl-p-diethylaminophenyl)-3-(1-ethyl-2-methylindole-3-il)-4-azaphthalide as an electron donative dye precursor, 0.19 parts of 2-hydroxy-4-methoxybenzophenone, 0.29 parts of 2,5-tert-octylhydroquinone, and 0.27 parts of Compound b-2 were dissolved in 0.93 parts of ethyl acetate. To the solution were then added 0.54 parts of phenethylcumene as a high boiling solvent. The mixture was then heated and homogenized. To the solution was then added 1.0 part of a xylylene diisocyanate/trimethylolpropane adduct (75 wt % ethyl acetate solution; Takenate D110N, available from Takeda Chemical Industries, Ltd.) as a capsule wall material. The mixture was then homogenized.

Separately, 36.4 parts of a 6 wt % aqueous solution of gelatin (MGP-9066, available from Nippi Gelatin Kogyo K.K.) comprising 0.07 parts of a 10% aqueous solution of sodium dodecylsulfonate incorporated therein were prepared. To the aqueous solution was then added the foregoing solution of electron donative dye precursor. The mixture was then subjected to emulsion dispersion by means of a homogenizer. The emulsion dispersion thus obtained was used later as a primary emulsion dispersion. Separately, 6.0 parts of 3-(o-methyl-p-diethylaminophenyl)-3-(1-ethyl-2-methylindole-3-il)-4-azaphthalide, 3.0 parts of 2-hydroxy-4-methoxybenzophenone, and 4.4 parts of 2,5-tert-octylhydroquinone were dissolved in 14.4 parts of ethyl acetate. To the solution were then added 8.4 parts of phenethylcumene as a high boiling solvent. The mixture was then homogenized to make a solution. To the solution were then added 7.8 parts of Takenate D110N and 5.9 parts of methylene diisocyanate (Millionate MR200, available from Nihon Polyurethane K.K.). The mixture was then homogenized. The resulting solution and 1.2 parts of a 10% aqueous solution of sodium dodecylsulfonate were then added to the primary emulsion dispersion. The mixture was then subjected to emulsion dispersion by means of a homogenizer. The resulting solution was used later as a secondary emulsion dispersion. To the secondary emulsion dispersion were then added 60.0 parts of water and 0.4 parts of diethylene triamine. The mixture was homogenized, and then heated with stirring to a temperature of 65° C. where it was allowed to undergo capsulation reaction for 3.5 hours to obtain the desired capsule solution. The average particle diameter of the capsules was 1.9 μm.

(Preparation of dispersion of electron attractive compound)

30 parts of bisphenol P as an electron attractive compound were added to 82.5 parts of a 2.0 wt % aqueous solution of gelatin (MGP-9066, available from Nippi Gelatin Kogyo K.K.). To the mixture were then added 7.5 parts of a 2 wt % aqueous solution of sodium 2-ethylhexylsulfosuccinate. The mixture was then subjected to dispersion by means of a ball mill for 24 hours to produce a dispersion. To the dispersion were then added 36.0 parts of a 15 wt % aqueous solution of gelatin (#750, available from Shinden Gelatin K.K.). The mixture was then homogenized to obtain the desired dispersion. The average particle diameter of particulate electron attractive compound in the dispersion was 0.5 μm.

(Preparation of coating solution)

The foregoing capsule solution of electron donative dye precursor, the foregoing dispersion of electron attractive compound, a 15 wt % aqueous solution of gelatin (#750, available from Shinden Gelatin K.K.), and a stilbene fluorescent brightening agent (Whitex-BB, available from Sumitomo Chemical Co., Ltd.) were mixed such an amount that the proportion of electron donative dye precursor/electron attractive compound, electron donative dye precursor/#750 gelatin and electron donative dye precursor/fluorescent brightening agent were 1/14, 1.1/1 and 5.3/1, respectively, to prepare the desired coating solution.

Preparation of coating solution of interlayer 1

To a 14 wt % aqueous solution of gelatin (#750, available from Shinden Gelatin K.K.) were added 8.2 parts of a 4 wt % aqueous solution of boric acid, 1.2 parts of a 2 wt % aqueous solution of sodium (4-nonylphenoxytrioxyethylene)butylsulfonate, and 7.5 parts of a 2 wt % aqueous solution of Compound d-1. The mixture was then homogenized to prepare the desired coating solution.

d-1

3/1 mixture (by weight) of:

$$(CH_2{=}CHSO_2CH_2CONHCH_2){-}(CH_2NHCOCH_2SO_2CH{=}CH_2)$$

and $$CH_2{-}(CH_2NHCOCH_2SO_2CH{=}CH_2)_2$$

Coating

Onto a support for photographic paper comprising a polyethylene laminated on a high quality paper were sequentially coated the foregoing heat-sensitive recording layer B, the interlayer 1, the foregoing heat-sensitive recording layer A, the protective layer containing the compound of formula (1), (2), (3), or (4), and other protective layers by means of a mayor bar. The material was then dried to obtain the desired heat-sensitive recording material. The coated amount of these layers were 7.12 g, 3.33 g, 2.50 g, and 1.23 g per $m^2$, respectively, as calculated in terms of solid content.

Heat-sensitive recording

Using a thermal head KST available from Kyocera Corp., printing was made on the foregoing heat-sensitive recording material with a recording pulsed signal whose width and voltage applied to the thermal head are determined such that the recording energy per unit area is 62 $mJ/mm^2$. The heat-sensitive recording material was then subjected to light from an ultraviolet light at a luminescence center wavelength of 365 nm and an output of 40 W for 15 seconds. Printing was made on the heat-sensitive recording material with a recording pulsed signal whose width and voltage applied to the thermal head are determined such that the recording energy per unit area is 86 $mJ/mm^2$, via the foregoing steps or without passing through the foregoing steps. As a result, the area on which only the former printing had been made provided a magenta-colored image. The area on which only the latter printing had been made provided a blue-colored image. The area on which both the two printing had been made was colored purple. The unrecorded area exhibited light gray.

EXAMPLE 6

A heat-sensitive recording material was prepared and evaluated in the same manner as in Example 5 except that the following diazo-coloring heat-sensitive recording layer C was provided between the diazo heat-sensitive recording layer A and the protective layer containing the compound of formula (1), (2), (3), or (4) and the following interlayer 2 was provided between the foregoing heat-sensitive recording layer C and the foregoing diazo heat-sensitive recording layer A.

Preparation of coating solution of heat-sensitive recording layer C (Preparation of capsule solution of diazonium salt compound)

3.5 parts of Compound e-1 having a maximum absorption wavelength of 420 nm (decomposition) as a diazonium salt compound and 0.9 parts of Compound e-2 were dissolved in 16.4 parts of ethyl acetate. To the solution were then added 9.8 parts of isopropylbiphenyl as a high boiling solvent. The mixture was then heated and homogenized. To the solution were then added 4.5 parts of a xylylene diisocyanate/trimethylolpropane adduct (75 wt % ethyl acetate solution; Takenate D110N, available from Takeda Chemical Industries, Ltd.) and 4.2 parts of a 30 wt % ethyl acetate solution of a xylylene diisocyanate/bisphenol A adduct. The mixture was then homogenized. Separately, 77 parts of a 6 wt % aqueous solution of gelatin comprising 0.36 parts of Scraph AG-8 (available from Nihon Seika K.K.) incorporated therein were prepared. To the aqueous solution was then added the foregoing solution of diazonium salt compound. The mixture was then subjected to emulsion dispersion by means of a homogenizer. To the resulting emulsion were then added 20 parts of water. The mixture was then homogenized. The solution was then allowed to undergo capsulation reaction at a temperature of 40° C. with stirring for 3 hours. Thereafter, the reaction solution was cooled to a temperature of 35° C. To the reaction solution were then added 6.5 parts of an ion-exchanging resin Amberlite IRA68 (available from Organo Corp.) and 13 parts of an ion-exchanging resin Amberlite IRC50 (available from Organo Corp.). The mixture was then stirred for 1 hour. The ion-exchanging resins were then removed by filtration to obtain a capsule solution. To 10 parts of the capsule solution were then added 0.4 parts of a 1 wt % aqueous solution of hydroquinone. The mixture was then stirred to obtain the desired capsule solution. The average particle diameter of the capsules was 0.91 μm.

(Preparation of coupler dispersion)

2.4 parts of Compound f-1 shown below as a coupler, 2.5 parts of triphenylguanidine, 2.5 parts of 1,1-(p-hydroxyphenyl)-2-ethylhexane, 3.6 parts of 4,4'-(p-phenylenediisopropylidene)diphenol, 3.2 parts of 2-ethylhexyl-4-hydroxybenzoate, and 0.8 parts of Compound f-2 were dissolved in 8.0 parts of ethyl acetate. To the solution were then added 1.0 part of Pionion A41C (available from Takemoto Yushi K.K.). The mixture was then heated and homogenized. The solution was then added to 75.0 parts of a 10 wt % aqueous solution of gelatin (#750 gelatin, available from Shinden Gelatin K.K.) which had been separately prepared. The mixture was then subjected to emulsion dispersion by means of a homogenizer. The remaining ethyl acetate was then evaporated from the solution to obtain the desired emulsion dispersion.

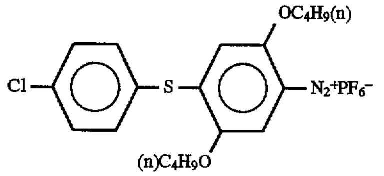

e-1

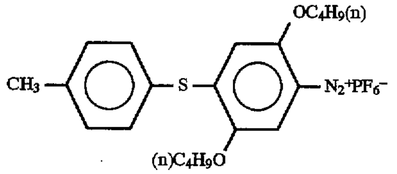

e-2

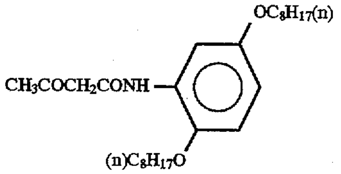

f-1

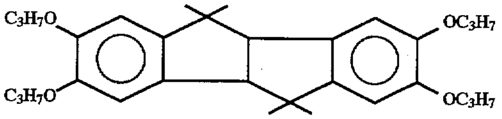

f-2

(Preparation of coating solution)

The foregoing capsule solution of diazonium salt compound, the foregoing emulsion dispersion of coupler and a styrene-butadiene rubber (SBR:SN307, available from Sumitomo Norgatac K.K.) were mixed in such an amount that the proportion of diazonium salt compound/coupler was 1/3.2 and the amount of the styrene-butadiene rubber was the same as that of gelatin in the coating solution to prepare the desired coating solution.

Preparation of coating solution of interlayer 2

To 57 parts of a 13% aqueous solution of gelatin were added 0.4 parts of a 2 wt % aqueous solution of sodium (4-nonylphenoxytrioxyethylene)butylsulfonate, 8.3 parts of a 2 wt % aqueous solution of Compound g-1, and 2.4 parts of PVP-k15 (GAF, available from Gokyo Sangyo K.K.). The mixture was then homogenized to prepare the desired coating solution.

g-1

3/1 mixture (by weight) of:

$$(CH_2{=}CHSO_2CH_2CONHCH_2){-}(CH_2NHCOCH_2SO_2CH{=}CH_2)$$

and $$CH_2{-}(CH_2NHCOCH_2SO_2CH{=}CH_2)_2$$

Coating

Onto a support for photographic paper comprising a polyethylene laminated on a high quality paper were sequentially coated the heat-sensitive recording layer B, the interlayer 1, the heat-sensitive recording layer A, the interlayer 2, the heat-sensitive recording layer C, the protective layer containing the compound of formula (1), (2), (3), or (4), and other protective layers by means of a mayor bar. The material was then dried to obtain the desired multi-color heat-sensitive recording material. The coated amount of these layers were 7.12 g, 3.28 g, 8.33 g, 3.13 g, 8.06 g, 2.50 g, and 1.23 g per $m^2$, respectively, as calculated in terms of solid content.

Heat-sensitive recording

Using a thermal head KST available from Kyocera Corp., printing was made on the foregoing heat-sensitive recording material with a recording pulsed signal whose width and voltage applied to the thermal head are determined such that the recording energy per unit area is 35 $mJ/mm^2$ to record a yellow image. The heat-sensitive recording material was then subjected to light from an ultraviolet light at a luminescence center wavelength of 420 nm and an output of 40 W for 10 seconds. Printing was made on the heat-sensitive recording material with a recording pulsed signal whose width and voltage applied to the thermal head are determined such that the recording energy per unit area is 66 $mJ/mm^2$, via the foregoing steps or without passing through the foregoing steps, to record a magenta image. Further, the heat-sensitive recording material was then subjected to light from an ultraviolet light at a luminescence center wavelength of 365 nm and an output of 40 W for 15 seconds. Printing was made on the heat-sensitive recording material with a recording pulsed signal whose width and voltage applied to the thermal head are determined such that the recording energy per unit area is 90 $mJ/mm^2$, via the foregoing steps or without passing through the foregoing steps, to record a cyan image. As a result, the yellow, magenta and cyan image areas and the recorded area on which both the yellow and magenta recording had been made provided were colored red. The area on which both the magenta and cyan recording were made was colored blue. The area on which both the yellow and cyan recording were made was colored green. The area on which the yellow, magenta and cyan recording were made at the same time was colored black. The unrecorded area exhibited light gray.

EXAMPLE 7

A heat-sensitive recording material was prepared and evaluated in the same manner as in Example 6 except that Compound (23) was used instead of Compound (40) and tricresyl phosphate was used instead of A-1.

EXAMPLE 8

A heat-sensitive recording material was prepared and evaluated in the same manner as in Example 6 except that Compound (4) was used instead of Compound (40) and 1.3 parts of Compound (R-12) were used as a reducing agent.

EXAMPLE 9

A heat-sensitive recording material was prepared and evaluated in the same manner as in Example 8 except that 3.3 parts of Compound (25) and 2 parts of Compound (26) were used instead of Compound (4) and Compound (R-14) was used instead of Compound (R-6) as a reducing agent.

EXAMPLE 10

A heat-sensitive recording material was prepared and evaluated in the same manner as in Example 8 except that 0.75 parts of Compound (1), 1.5 parts of Compound (2) and 3.0 parts of Compound (3) were used instead of Compound (4).

EXAMPLE 11

A heat-sensitive recording material was prepared and evaluated in the same manner as in Example 8 except that 4.0 parts of Compound (3) and 2.3 parts of Compound (22) were used instead of Compound (4).

EXAMPLE 12

A heat-sensitive recording material was prepared and evaluated in the same manner as in Example 6 except that the following interlayer 3 was used instead of the interlayers 1 and 2, respectively.

Preparation of coating solution of interlayer 3

1.1 parts of Compound (3) were homogenized with 0.7 parts of ethyl acetate and 0.59 parts of A-1 as a phthalic ester solvent. To the solution were then added 0.5 parts of a xylylene diisocyanate/trimethylolpropane adduct (75 wt % ethyl acetate solution; Takenate D110N, available from Takeda Chemical Industries, Ltd.). The mixture was then homogenized. Separately, 36.4 parts of a 6 wt % aqueous solution of gelatin (MGP-9066, available from Nippi Gelatin K.K.) comprising 1.8 parts of a 10% aqueous solution of sodium dodecylsulfonate were prepared. To the aqueous solution was then added the foregoing solution of electron donative dye precursor. The mixture was then subjected to emulsion dispersion by means of a homogenizer. The emulsion dispersion was then allowed to undergo capsulation reaction at a temperature of 40° C. with stirring for 3 hours to obtain the desired coating solution.

Coating

Onto a support for photographic paper comprising a polyethylene laminated on a high quality paper were sequentially coated the heat-sensitive recording layer B, the interlayer 3, the heat-sensitive recording layer A, the interlayer 3, the heat-sensitive recording layer C, the protective layer containing the compound of formula (1), (2), (3), or (4), and other protective layers by means of a mayor bar. The material was then dried to obtain the desired multi-color heat-sensitive recording material. The coated amount of these layers were 7.12 g, 4.58 g, 8.33 g, 4.57 g, 8.06 g, and 1.23 g per $m^2$, respectively, as calculated in terms of solid content.

Comparative Example 1

A heat-sensitive recording material was prepared and evaluated in the same manner as in Example 1 except that Compound B-1 was used instead of Compound (3).

Comparative Example 2

A heat-sensitive recording material was prepared and evaluated in the same manner as in Example 1 except that the protective layer containing the compound of formula (1), (2), (3), or (4) was not provided.

Comparative Example 3

A heat-sensitive recording material was prepared and evaluated in the same manner as in Example 2 except that Compound B-1 was used instead of Compound (23).

Comparative Example 4

A heat-sensitive recording material was prepared and evaluated in the same manner as in Example 2 except that the protective layer containing the compound of formula (1), (2), (3), or (4) was not provided.

Comparative Example 5

A heat-sensitive recording material was prepared and evaluated in the same manner as in Example 3 except that Compound B-1 was used instead of Compound (12).

Comparative Example 6

A heat-sensitive recording material was prepared and evaluated in the same manner as in Example 3 except that the protective layer containing the compound of formula (1), (2), (3), or (4) was not provided.

Comparative Example 7

A heat-sensitive recording material was prepared and evaluated in the same manner as in Example 4 except that Compound B-1 was used instead of Compound (7).

Comparative Example 8

A heat-sensitive recording material was prepared and evaluated in the same manner as in Example 4 except that the protective layer containing the compound of formula (1), (2), (3), or (4) was not provided.

Comparative Example 9

A heat-sensitive recording material was prepared and evaluated in the same manner as in Example 5 except that Compound B-1 was used instead of Compound (40).

Comparative Example 10

A heat-sensitive recording material was prepared and evaluated in the same manner as in Example 5 except that the protective layer containing the compound of formula (1), (2), (3), or (4) was not provided.

Comparative Example 11

A heat-sensitive recording material was prepared and evaluated in the same manner as in Example 6 except that Compound B-1 was used instead of Compound (40).

Comparative Example 12

A heat-sensitive recording material was prepared and evaluated in the same manner as in Example 6 except that the protective layer containing the compound of formula (1), (2), (3), or (4) was not provided.

Comparative Example 13

A heat-sensitive recording material was prepared and evaluated in the same manner as in Example 7 except that Compound B-1 was used instead of Compound (23).

Comparative Example 14

A heat-sensitive recording material was prepared and evaluated in the same manner as in Example 7 except that the protective layer containing the compound of formula (1), (2), (3), or (4) was not provided.

Comparative Example 15

A heat-sensitive recording material was prepared and evaluated in the same manner as in Example 8 except that Compound B-1 was used instead of Compound (4).

Comparative Example 16

A heat-sensitive recording material was prepared and evaluated in the same manner as in Example 8 except that the protective layer containing the compound of formula (1), (2), (3), or (4) was not provided.

Comparative Example 17

A heat-sensitive recording material was prepared and evaluated in the same manner as in Example 9 except that Compound B-2 was used instead of Compounds (25) and (26).

Comparative Example 18

A heat-sensitive recording material was prepared and evaluated in the same manner as in Example 9 except that the protective layer containing the compound of formula (1), (2), (3), or (4) was not provided.

Comparative Example 19

A heat-sensitive recording material was prepared and evaluated in the same manner as in Example 10 except that Compound B-1 was used instead of Compounds (1), (2) and (3).

Comparative Example 20

A heat-sensitive recording material was prepared and evaluated in the same manner as in Example 10 except that the protective layer containing the compound of formula (1), (2), (3), or (4) was not provided.

Comparative Example 21

A heat-sensitive recording material was prepared and evaluated in the same manner as in Example 11 except that Compound B-1 was used instead of Compounds (3) and (22).

Comparative Example 22

A heat-sensitive recording material was prepared and evaluated in the same manner as in Example 11 except that the protective layer containing the compound of formula (1), (2), (3), or (4) was not provided.

Comparative Example 23

A heat-sensitive recording material was prepared and evaluated in the same manner as in Example 12 except that Compound B-1 was used instead of Compound (40).

Comparative Example 24

A heat-sensitive recording material was prepared and evaluated in the same manner as in Example 12 except that the protective layer containing the compound of formula (1), (2), (3), or (4) was not provided.

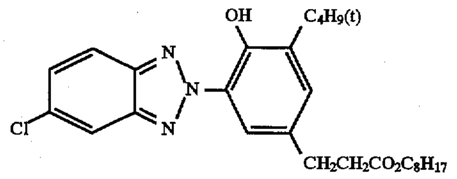
B-1

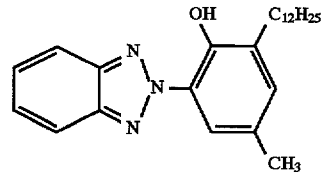
B-2

The results of the evaluation are shown in Tables 2 and 3.

TABLE 2

| Example | Fix-ability | Residual density Recording layer A (%) | Recording layer B (%) | Recording layer C (%) | Reflection density of nonprinted area |
|---|---|---|---|---|---|
| 1 | good | 79 | — | — | 0.1 |
| 2 | good | 75 | — | — | 0.09 |

TABLE 2-continued

| | | Residual density | | | |
|---|---|---|---|---|---|
| Example | Fix-ability | Recording layer A (%) | Recording layer B (%) | Recording layer C (%) | Reflection density of nonprinted area |
| 3 | good | 77 | — | — | 0.1 |
| 4 | good | 80 | — | — | 0.1 |
| 5 | good | 78 | 80 | — | 0.1 |
| 6 | good | 93 | 80 | 98 | 0.17 |
| 7 | good | 92 | 90 | 99 | 0.16 |
| 8 | good | 93 | 91 | 98 | 0.17 |
| 9 | good | 92 | 90 | 99 | 0.17 |
| 10 | good | 93 | 93 | 100 | 0.16 |
| 11 | good | 92 | 90 | 98 | 0.16 |
| 12 | good | 90 | 91 | 95 | 0.18 |

TABLE 3

| | | Residual density | | | |
|---|---|---|---|---|---|
| Comparative Example | Fix-ability | Recording layer A (%) | Recording layer B (%) | Recording layer C (%) | Reflection density of nonprinted area |
| 1 | poor | 80 | — | — | 0.1 |
| 2 | good | 70 | — | — | 0.25 |
| 3 | poor | 77 | — | — | 0.1 |
| 4 | good | 69 | — | — | 0.25 |
| 5 | poor | 75 | — | — | 0.11 |
| 6 | good | 69 | — | — | 0.26 |
| 7 | poor | 78 | — | — | 0.09 |
| 8 | good | 69 | — | — | 0.26 |
| 9 | poor | 77 | 70 | — | 0.1 |
| 10 | good | 68 | 81 | — | 0.3 |
| 11 | poor | 76 | 80 | 90 | 0.14 |
| 12 | good | 66 | 89 | 98 | 0.25 |
| 13 | poor | 91 | 90 | 99 | 0.16 |
| 14 | good | 82 | 88 | 90 | 0.23 |
| 15 | poor | 92 | 91 | 98 | 0.15 |
| 16 | good | 85 | 87 | 89 | 0.24 |
| 17 | poor | 90 | 91 | 99 | 0.16 |
| 18 | good | 83 | 85 | 90 | 0.23 |
| 19 | poor | 91 | 93 | 99 | 0.15 |
| 20 | good | 85 | 85 | 89 | 0.25 |
| 21 | poor | 90 | 91 | 99 | 0.16 |
| 22 | good | 85 | 88 | 88 | 0.26 |
| 23 | poor | 90 | 92 | 98 | 0.25 |
| 24 | good | 83 | 81 | 90 | 0.16 |

The compound represented by formula (1), (2), (3), or (4) has substantially no effect of absorbing ultraviolet rays at a wavelength range of 340 to 400 nm. It is activated to exhibit an absorptivity in this wavelength range only when irradiated with light for a prolonged period of time or irradiated with strong short wave light.

While the invention has been described in detail and with reference to specific embodiments thereof, it will be apparent to one skilled in the art that various changes and modifications can be made therein without departing from the spirit and scope thereof.

What is claimed is:

1. A heat-sensitive recording material comprising a support having thereon a heat-sensitive recording layer and a protective layer in this sequence, said heat-sensitive recording material containing a compound represented by formula (1), (2), (3), or (4):

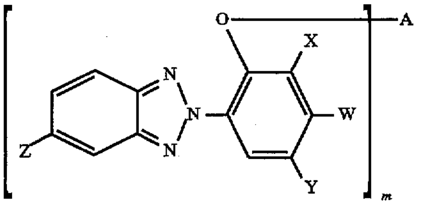
(1)

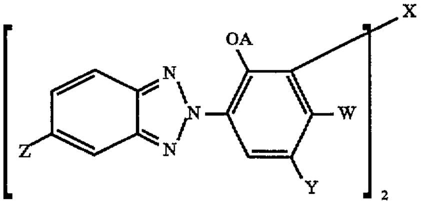
(2)

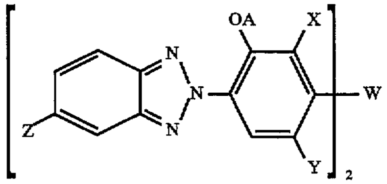
(3)

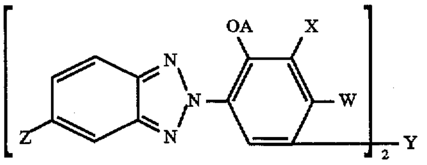
(4)

wherein m represents an integer 1 or 2;

A represents $—SO_2—R$, $—CO—R$, $—CO_2—R$, $—CONH—R$, $—POR_1R_2$, $—CH_2R_3$, or $—SiR_4R_5R_6$, in which R represents an alkyl group or an aryl group, $R_1$ and $R_2$ each independently represent an alkoxy group, an aryloxy group, an alkyl group, or an aryl group, $R_3$ represents a phenyl group substituted by at least one of a nitro group or a methoxy group, and $R_4$, $R_5$, and $R_6$ each independently represent an alkyl group or an aryl group, in formulae (2) to (4) and in formula (1) where m is 1, or represents $—SO_2R_7SO_2—$, $—CO—$, $—COCO—$, $—COR_7CO—$, $—SO_2—$, or $—SO—$, in which $R_7$ represents an alkylene group or an arylene group, in formula (1) where m is 1;

X represents a hydrogen atom, an alkyl group, an alkoxy group, an aryl group, or a halogen atom in formulae (1), (3) and (4), or represents an alkylene group, $—OR_7O—$, or $—OCOR_7CO_2—$ in formula (2);

W represents a hydrogen atom, an alkyl group, an alkoxy group, an aryl group, or a halogen atom in formulae (1), (2) and (4), or represents $—OR_7O—$ or $—OCOR_7CO_2—$ in formula (3);

Y represents a hydrogen atom, an alkyl group, an alkoxy group, an aryl group, or a halogen atom in formulae (1), (2) and (3), or represents $—OR_7O—$, $—OCOR_7CO_2—$, $—CH_2CH_2CO_2R_7OCOCH_2CH_2—$, $—CH_2CH_2OCOR_7CO_2CH_2—$, or $—CH_2CH_2CON(R_8)R_7N(R_8)COCH_2CH_2—$, in which $R_8$ represents a hydrogen atom or an alkyl group, in formula (4); and Z represents a hydrogen atom, a halogen atom, an alkyl group, or an alkoxy group;

wherein said heat-sensitive recording layer comprises a diazonium salt compound and couplers which exhibit a color by reacting with said diazonium salt compound.

2. A heat-sensitive recording material as claimed in claim 1, wherein said compound represented by formula (1), (2), (3), or (4) is contained in microcapsules.

3. A heat-sensitive recording material as claimed in claim 1, wherein said compound represented by formula (1), (2), (3), or (4) is incorporated in said protective layer.

4. A heat-sensitive recording material as claimed in claim 2, wherein said compound represented by formula (1), (2), (3), or (4) is incorporated in said protective layer.

5. A heat-sensitive recording material as claimed in claim 1, wherein said heat-sensitive recording layer comprises a heat-sensitive recording layer A and a heat-sensitive recording layer B, which are coated in this sequence, said heat-sensitive layer A comprising an electron donative dye and an electron attractive compound and said heat-sensitive recording layer B comprising a diazonium salt compound and couplers which exhibit colors by reacting with said diazonium salt compound.

6. A heat-sensitive recording material as claimed in claim 2, wherein said heat-sensitive recording layer comprises a heat-sensitive recording layer A and a heat-sensitive recording layer B, which are coated in this sequence, said heat-sensitive layer A comprising an electron donative dye and an electron attractive compound and said heat-sensitive recording layer B comprising a diazonium salt compound and couplers which exhibit colors by reacting with said diazonium salt compound.

7. A heat-sensitive recording material as claimed in claim 3, wherein said heat-sensitive recording layer comprises a heat-sensitive recording layer A and a heat-sensitive recording layer B, which are coated in this sequence, said heat-sensitive layer A comprising an electron donative dye and an electron attractive compound and said heat-sensitive recording layer B comprising a diazonium salt compound and couplers which exhibit colors by reacting with said diazonium salt compound.

8. A heat-sensitive recording material as claimed in claim 1, wherein said heat-sensitive recording layer comprises a heat-sensitive recording layer A, a heat-sensitive recording layer B, and a heat-sensitive recording layer C, which are coated in this sequence, said heat-sensitive recording layer A comprising an electron donative dye and an electron attractive compound, said heat-sensitive recording layer B comprising a diazonium salt compound having a maximum absorption wavelength of 360±20 nm and couplers which exhibit colors by reacting with said diazonium salt compound, and said heat-sensitive recording layer C comprising a diazonium salt compound having a maximum absorption wavelength of 400±20 nm and couplers which exhibit colors by reacting with said diazonium salt compound.

9. A heat-sensitive recording material as claimed in claim 2, wherein said heat-sensitive recording layer comprises a heat-sensitive recording layer A, a heat-sensitive recording layer B, and a heat-sensitive recording layer C, which are coated in this sequence, said heat-sensitive recording layer A comprising an electron donative dye and an electron attractive compound, said heat-sensitive recording layer B comprising a diazonium salt compound having a maximum absorption wavelength of 360±20 nm and couplers which exhibit colors by reacting with said diazonium salt compound, and said heat-sensitive recording layer C comprising a diazonium salt compound having a maximum absorption wavelength of 400±20 nm and couplers which exhibit colors by reacting with said diazonium salt compound.

10. A heat-sensitive recording material as claimed in claim 3, wherein said heat-sensitive recording layer comprises a heat-sensitive recording layer A, a heat-sensitive recording layer B, and a heat-sensitive recording layer C, which are coated in this sequence, said heat-sensitive recording layer A comprising an electron donative dye and an electron attractive compound, said heat-sensitive recording layer B comprising a diazonium salt compound having a maximum absorption wavelength of 360±20 nm and couplers which exhibit colors by reacting with said diazonium salt compound, and said heat-sensitive recording layer C comprising a diazonium salt compound having a maximum absorption wavelength of 400±20 nm and couplers which exhibit colors by reacting with said diazonium salt compound.

* * * * *